United States Patent
Sasaki

(10) Patent No.: US 10,224,495 B2
(45) Date of Patent: Mar. 5, 2019

(54) ORGANIC EL DISPLAY PANEL, ORGANIC EL DISPLAY DEVICE, AND METHOD OF MANUFACTURING ORGANIC EL DISPLAY PANEL AND ORGANIC EL DISPLAY DEVICE

(71) Applicant: JOLED INC., Tokyo (JP)

(72) Inventor: Atsushi Sasaki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/484,163

(22) Filed: Apr. 11, 2017

(65) Prior Publication Data

US 2017/0294610 A1    Oct. 12, 2017

(30) Foreign Application Priority Data

Apr. 11, 2016 (JP) ................................. 2016-078922

(51) Int. Cl.
| | | |
|---|---|---|
| *H01L 51/00* | (2006.01) | |
| *H01L 27/32* | (2006.01) | |
| *H01L 51/56* | (2006.01) | |

(52) U.S. Cl.
CPC ...... *H01L 51/0097* (2013.01); *H01L 27/3211* (2013.01); *H01L 27/3276* (2013.01); *H01L 51/56* (2013.01); *H01L 2227/323* (2013.01); *H01L 2251/5338* (2013.01); *H01L 2251/558* (2013.01)

(58) Field of Classification Search
CPC ......... H01L 33/62; H01L 33/52; H01L 33/00; H01L 27/15
USPC ...................................... 257/88, 91; 438/34
See application file for complete search history.

(56) References Cited

U.S. PATENT DOCUMENTS

| | | | |
|---|---|---|---|
| 5,443,922 A | 8/1995 | Nishizaki et al. | |
| 6,249,088 B1* | 6/2001 | Chang | H05B 33/0821 315/185 R |
| 2006/0204675 A1* | 9/2006 | Gao | G02F 1/133305 428/1.1 |
| 2009/0219225 A1* | 9/2009 | Cope | G09F 9/30 345/55 |
| 2010/0148654 A1* | 6/2010 | Yan | H05K 1/028 313/243 |
| 2010/0330338 A1* | 12/2010 | Boyce | B29C 59/02 428/156 |
| 2014/0042406 A1* | 2/2014 | Degner | H01L 27/326 257/40 |
| 2014/0217397 A1* | 8/2014 | Kwak | H01L 27/1218 257/43 |

(Continued)

FOREIGN PATENT DOCUMENTS

| | | |
|---|---|---|
| JP | 5-163488 A | 6/1993 |
| JP | 2003-280548 A | 10/2003 |
| JP | 2010-8479 A | 1/2010 |

*Primary Examiner* — Sheng-Bai Zhu
(74) *Attorney, Agent, or Firm* — Hauptman Ham, LLP

(57) ABSTRACT

In an organic electroluminescence (EL) display panel including: a substrate that is flexible and is made of a resin material; a plurality of light-emitting elements that are disposed on the substrate and are spaced away from one another; and a plurality of wire units that are disposed on the substrate and establish electrical connection between the plurality of light-emitting elements, a first region of the substrate that is below the light-emitting elements has greater stiffness than a second region of the substrate that is a remainder of the substrate.

14 Claims, 16 Drawing Sheets

(56) References Cited

U.S. PATENT DOCUMENTS

| | | | |
|---|---|---|---|
| 2014/0231835 A1* | 8/2014 | Yamada | H05K 1/144 257/88 |
| 2014/0300529 A1* | 10/2014 | Kim | H01L 27/326 345/80 |
| 2017/0092884 A1* | 3/2017 | Zhang | H01L 51/0097 |

* cited by examiner

ORGANIC EL DISPLAY PANEL, ORGANIC EL DISPLAY DEVICE, AND METHOD OF MANUFACTURING ORGANIC EL DISPLAY PANEL AND ORGANIC EL DISPLAY DEVICE This application is based on an application No. 2016-078922 filed on Apr. 11, 2016, the contents of which are hereby incorporated by reference.

BACKGROUND OF THE DISCLOSURE

(1) Technical Field

The present disclosure relates to an organic electroluminescence (EL) display panel that includes an organic EL light-emitting element making use of an electroluminescent phenomenon of an organic material, and an organic EL display device that makes use of such an organic EL display panel. Particularly, the present disclosure relates to a flexible organic EL display panel, and a curved surface display that makes use of such a flexible organic EL display panel.

(2) Description of Related Art

Recently, development of flat displays such as liquid-crystal displays and organic EL displays has enabled thinning and lightening of displays. This has improved freedom in selection of sizes and shapes of displays.

A typical flat display (also referred to as "display device") includes an organic EL display panel (hereinafter referred to as "display panel") receiving scanning signals, video signals, electricity, and the like. The display panel is formed by disposing organic EL light-emitting elements on a substrate made of a material such as a resin or a glass and disposing, in a matrix, wire groups supplying scanning signals, video signals, electricity, and the like to the organic EL light-emitting elements.

When a display panel for such a flat display is manufactured by using a thin substrate, the display panel can be bent so as to form a two-dimensionally curved image display surface. For example, Japanese Patent Application Publication No. 2003-280548 and Japanese Patent Application Publication No. 2010-008479 disclose curved displays in which the display panels are bent so as to form image display surfaces having a convex shape or a concave shape. Such curved displays having a two-dimensionally curved surface are advantageous because they can be installed in corners, around pillars, and the like, while saving space.

SUMMARY OF THE DISCLOSURE

(1) Problem to be Solved

However, the technologies disclosed in these documents require performing processes for bending the substrate after forming of the display panel, at a temperature that would not affect the organic EL light-emitting elements. Because of this, the display panel can be bent only to a limited extent and only into limited shapes. For example, when shaping the organic EL display panel into a three-dimensionally curved surface shape such as a hemisphere, wrinkling and/or tearing may occur in the organic EL display panel. This makes shaping multiple organic EL display panels into the same shape difficult. Furthermore, in the field of curved displays, recent sophistication of designing has increased demand for displays adaptable to more different curved surfaces than conventional curved displays.

The present disclosure has been achieved in view of the above problems, and an aim thereof is to provide an organic EL display panel which can be shaped so as to adapt to various three-dimensionally curved surface shapes, an organic EL display device using such an organic EL display panel, and a method of manufacturing such an organic EL display device.

(2) Means for Solving Problem

In order to solve the above problems, an organic EL display panel pertaining to one aspect of the present disclosure includes: a substrate that is flexible and is made of a resin material; a plurality of light-emitting elements that are disposed on the substrate and are spaced away from one another; and a plurality of wire units that are disposed on the substrate and establish electrical connection between the plurality of light-emitting elements. In the organic EL display panel, a first region of the substrate that is below the light-emitting elements has greater stiffness than a second region of the substrate that is a remainder of the substrate.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

DESCRIPTION OF EMBODIMENT

<<Aspects of Present Disclosure>>

Figure 1:
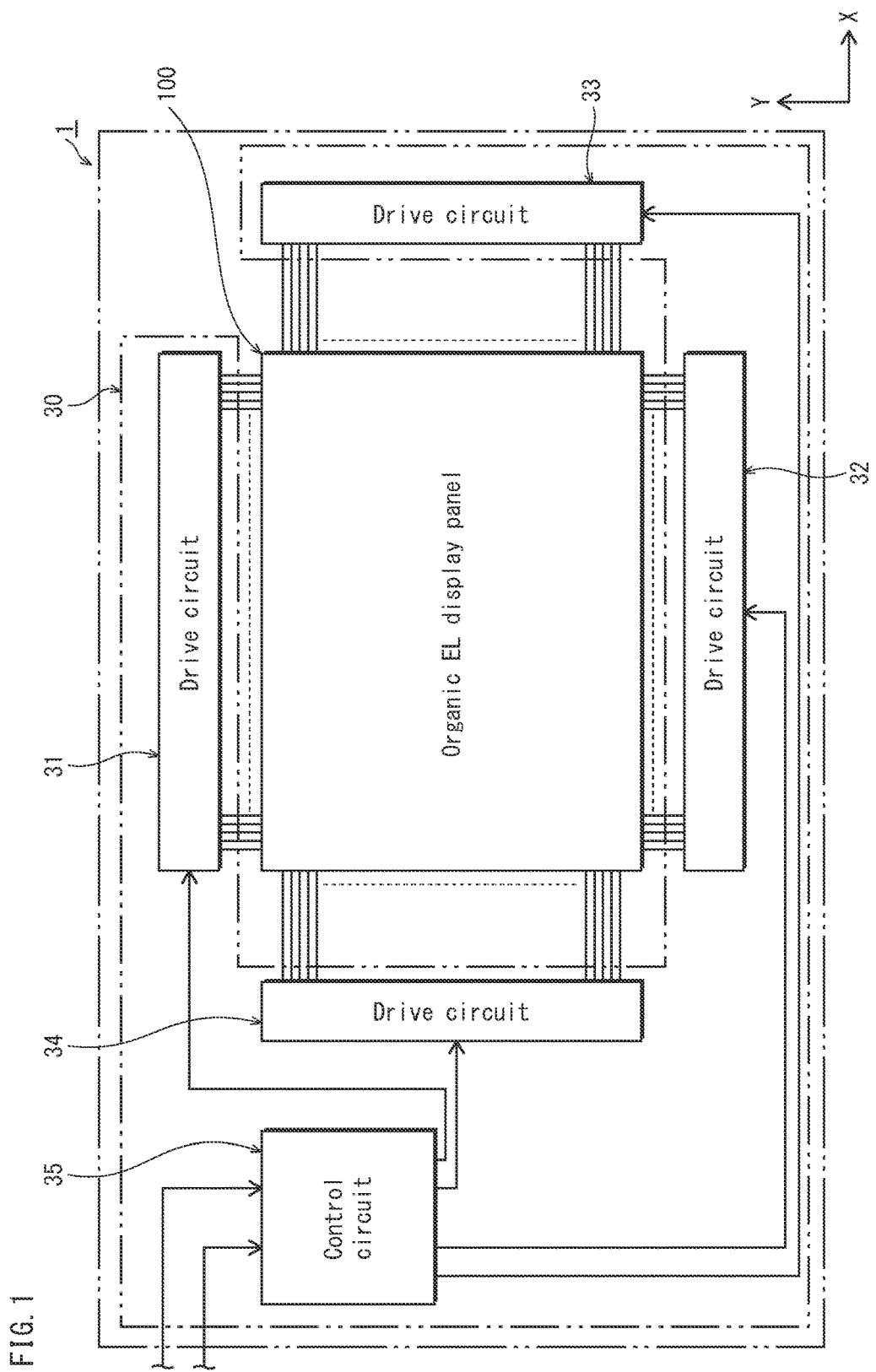
FIG. 1 is a schematic block diagram illustrating a circuit structure of an organic EL display device 1 pertaining to an embodiment.

An organic EL display panel pertaining to one aspect of the present disclosure includes: a substrate that is flexible and is made of a resin material; a plurality of light-emitting elements that are disposed on the substrate and are spaced away from one another; and a plurality of wire units that are disposed on the substrate and establish electrical connection between the plurality of light-emitting elements. In the organic EL display panel, a first region of the substrate that is below the light-emitting elements has greater stiffness than a second region of the substrate that is a remainder of the substrate.

Further, in the organic EL display panel pertaining to one aspect of the present disclosure, the wire units may be disposed above the second region. This structure enables an organic EL display panel to be shaped so as to adapt to various three-dimensionally curved surfaces without causing wrinkling and tearing of the organic EL display panel. This achieves an organic EL display device having a three-dimensionally curved image display surface. Accordingly, curved displays with a larger variety of curved shapes than conventional curved displays are achieved.

Further, in the organic EL display panel pertaining to one aspect of the present disclosure, the substrate may have a greater mean thickness at the first region than at the second region. This structure prevents the light-emitting elements above the first region of the substrate from deforming, because of great stiffness of the first region. Meanwhile, due to having small stiffness, the second region deforms easily. Accordingly, the second region contributes to great overall flexibility of the substrate.

Further, in the organic EL display panel pertaining to one aspect of the present disclosure, the substrate may include a first layer and a second layer, the second layer may include a plurality of solid portions that are spaced away from each other in plan view of the substrate and a plurality of fence portions connecting the solid portions, the solid portions and the fence portions defining openings in the second layer, in plan view of the substrate, regions in which the solid portions are present may correspond to the first region, the light-emitting elements may be disposed on the solid portions, and the wire units may be disposed on the fence portions. This structure has the light-emitting elements above upper surfaces of the solid portions, which are located at the first region of the substrate, and great stiffness of the first region prevents the light-emitting elements from deforming. Meanwhile, due to having small stiffness, the second region deforms easily. Accordingly, the second region contributes to great overall flexibility of the substrate.

Further, in the organic EL display panel pertaining to one aspect of the present disclosure, the first layer and the second layer may be made of a same material, and in a thickness direction of the substrate, the first layer and the second layer may be continuous with each other in the first region. With this structure, great overall flexibility of the substrate can be achieved by simply providing the substrate with different cross-sectional shapes in the first region and the second region.

Further, in the organic EL display panel pertaining to one aspect of the present disclosure, the first layer may be made of a first material, the second layer may be made of a second material, and the first material may have greater stiffness than the second material. This structure further prevents the light-emitting elements from deforming because of the great stiffness of portions of the substrate forming the first region. Meanwhile, due to having small stiffness, the second region deforms easily. Accordingly, the second region contributes to great overall flexibility of the substrate.

Further, in the organic EL display panel pertaining to one aspect of the present disclosure, the fence portions may be curved in plan view of the substrate. This structure enables the fence portions to deform in accordance with deformation of the second region.

Further, in the organic EL display panel pertaining to one aspect of the present disclosure, the substrate may be light-transmissive. This structure achieves visual recognition of a displayed image from both sides of the substrate.

Further, in the organic EL display panel pertaining to one aspect of the present disclosure, for any pair of a first portion and a second portion that are each a portion of the substrate, the first portion being closer to a periphery of the substrate than the second portion, an arrangement of the light-emitting elements may be such that a distance between ones of the light-emitting elements on the first portion is wider than a distance between ones of the light-emitting elements on the second portion. In this structure, the plurality of light-emitting elements are disposed on the sheet-like substrate so that the plurality of light-emitting elements are distributed in a substantially uniform manner above the inner surface of the receiving substrate when the substrate is attached to the receiving substrate.

An organic EL display device pertaining to one aspect of the present disclosure includes: the organic EL display panel pertaining to one aspect of the present disclosure; and a receiving substrate having a three-dimensionally curved surface. This structure achieves organic EL display devices having image display surfaces with various three-dimensionally curved surfaces. Accordingly, curved displays applying to a larger variety of shapes than conventional curved displays are achieved.

Further, the organic EL display device pertaining to one aspect of the present disclosure may further include a sealing layer and an adhesion layer. In the organic EL display device, the sealing layer, the organic EL display panel pertaining to one aspect of the present disclosure, the adhesion layer, and the receiving substrate may be laminated in this order. In this structure, the adhesion layer has a function of cancelling out a difference between the surface shape of the organic EL display panel and the surface shape of the receiving substrate, and adhering the organic EL display panel and the receiving substrate together. Further, in this structure, the adhesion layer prevents the organic EL display panel from being exposed to moisture, air, or the like.

Further, in the organic EL display device pertaining to one aspect of the present disclosure, the receiving substrate may be light-transmissive, and a display surface of the organic EL display panel may face the receiving substrate. This structure achieves visual recognition, through the receiving substrate, of an image displayed by the plurality of pixels.

Further, in the organic EL display device pertaining to one aspect of the present disclosure, a display surface of the organic EL display panel may face away from the receiving substrate. This structure achieves visual recognition, through the sealing layer, of an image displayed by the plurality of pixels, even when the receiving substrate is made of a light-shielding material such as a metal or a non-transparent resin.

Further, in the organic EL display device pertaining to one aspect of the present disclosure, an arrangement of the light-emitting elements may be such that distance distribution between the light-emitting elements on the substrate is set in accordance with a shape of the receiving substrate. This structure ensures substantially uniform distribution of the plurality of light-emitting elements above inner surfaces of receiving substrates of various different shapes.

A method of manufacturing an organic EL display device pertaining to one aspect of the present disclosure includes: preparing the organic EL display panel pertaining to one aspect of the present disclosure; stretching the organic EL display panel along a three-dimensionally curved surface of a receiving substrate and adhering a first surface of the organic EL display panel to the receiving substrate via an adhesion layer; and covering a second surface of the organic EL display panel opposite the first surface with a sealing layer. This method enables an organic EL display panel to be shaped so as to adapt to various three-dimensionally curved surfaces without causing wrinkling and tearing of the organic EL display panel. This achieves manufacturing of an organic EL display device having a three-dimensionally curved image display surface.

Further, in the method pertaining to one aspect of the present disclosure, the organic EL display panel may be stretched so that a stretch ratio of the organic EL display panel differs depending on directions along a surface of the organic EL display panel. This achieves an organic EL display device having an organic EL display panel that is adaptable to a receiving substrate with a three-dimensionally curved surface shape, without causing wrinkling and tearing of the organic EL display panel.

Further, in the method pertaining to one aspect of the present disclosure, the organic EL display panel may be stretched so that different portions of the organic EL display panel have different stretch ratios. This achieves organic EL display devices having organic display panels adaptable to receiving substrates with a large variety of three-dimensionally curved surface shapes.

EMBODIMENT

1 Circuit Structure
1.1 Circuit Structure of Display Device 1

The following describes a circuit structure of an organic EL display device 1 (hereinafter referred to as "display device 1") pertaining to an embodiment, with reference to FIG. 1.

As illustrated in FIG. 1, the display device 1 includes an organic EL display panel 100 (hereinafter referred to as "display panel 100") and a drive-control circuit unit 30 connecting to the display panel 100.

The display panel 100 is an organic EL panel that makes use of an electroluminescent phenomenon of an organic material. The display panel 100 includes a plurality of organic EL light-emitting elements 10 that are, for example, arrayed in a matrix. The drive-control circuit unit 30 includes four drive circuits 31, 32, 33, and 34 and a control circuit 35.

Meanwhile, arrangement of circuits in the drive-control circuit unit 30 relative to the display panel 100 in the display device 1 is not limited to the arrangement illustrated in FIG. 1.

1.2 Circuit Structure of Display Panel 100

In the display panel 100, each of the plurality of organic EL light-emitting elements 10 includes three subpixel circuits 10sa each emitting light of a different one of three colors red (R), green (G), and blue (B). A structure of each of the subpixel circuits 10sa is described with reference to FIG. 2.

Figure 2:
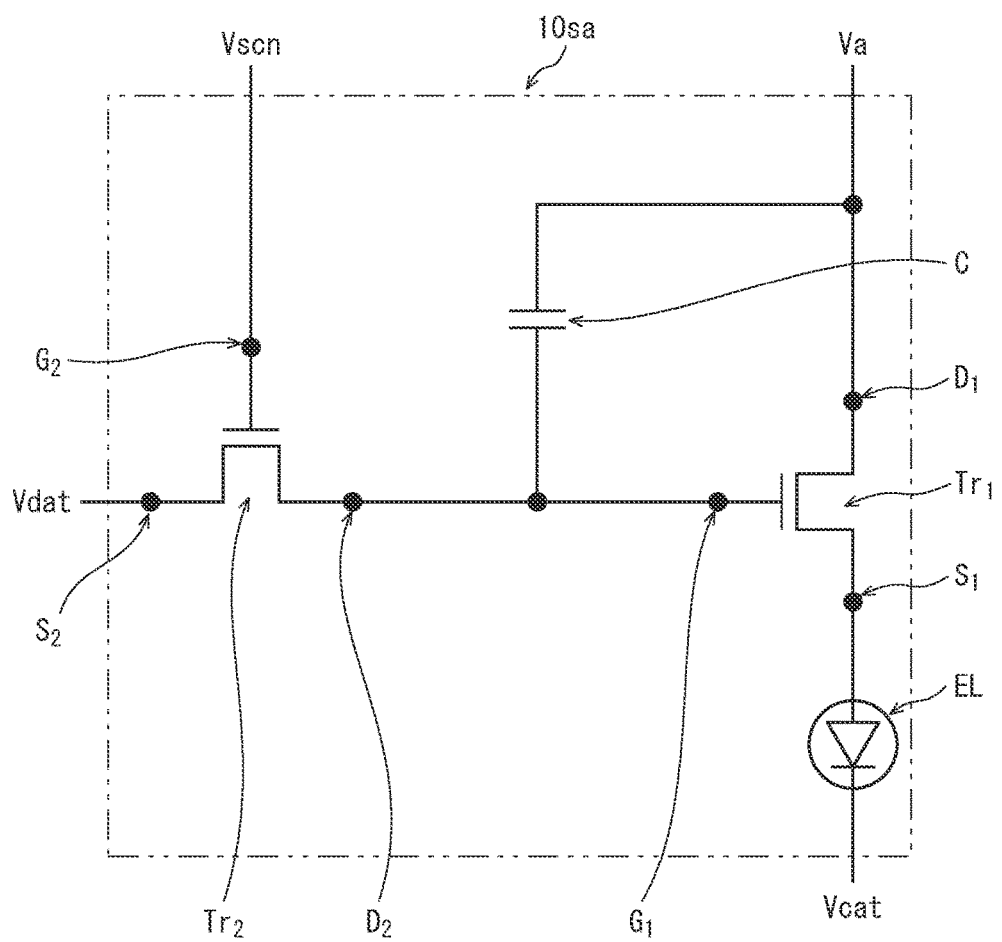
FIG. 2 is a circuit diagram illustrating a structure of a subpixel circuit 10sa of an organic EL display panel 100 used for the organic EL display device 1.

As illustrated in FIG. 2, in the display panel 100 pertaining to the present embodiment, each of the subpixel circuits 10sa includes two transistors, namely a transistor $Tr_1$ and a transistor $Tr_2$, an organic EL light-emitting element unit EL that is a light-emitting unit, and a capacitor C. The transistor $Tr_1$ is a drive transistor, and the transistor $Tr_2$ is a switching transistor.

The switching transistor $Tr_2$ includes a gate $G_2$ connecting to a scanning line Vscn, a source $S_2$ connecting to a data line Vdat, and a drain $D_2$ connecting to a gate $G_1$ of the drive transistor $Tr_1$.

The drive transistor $Tr_1$ includes a drain $D_1$ connecting to a power source line Va, and a source $S_1$ connecting to an anode of the organic EL light-emitting element unit EL. A cathode of the organic EL light-emitting element unit EL connects to a ground line Vcat.

The capacitor C connects the drain $D_2$ of the switching transistor $Tr_2$ and the gate $G_1$ of the drive transistor $Tr_1$ to the power source line Va.

In the display panel 100, each set of a plurality of adjacent subpixel circuits 10sa (for example, three subpixel circuits 10sa each emitting light of a different one of three colors red (R), green (G), and blue (B)) forms a pixel 10a, and a region in which a plurality of pixels 10a are distributed forms a pixel region.

Each of the subpixels 10sa has a gate line that extends from the gate $G_2$ and connects to a scanning line Vscn, which extends from the outside of the display panel 100. Each of the subpixel circuits 10sa has a source line that extends from the source $S_2$ and connects to a data line Vdat, which extends from the outside of the display panel 100.

Power source lines of the subpixel circuits 10sa are integrated into a single line that connects to a power source line Va. Likewise, ground lines of the subpixel circuits 10sa are integrated into a single line that connects to a ground line Vcat.

2. Structure of Display Device 1

Figure 3:
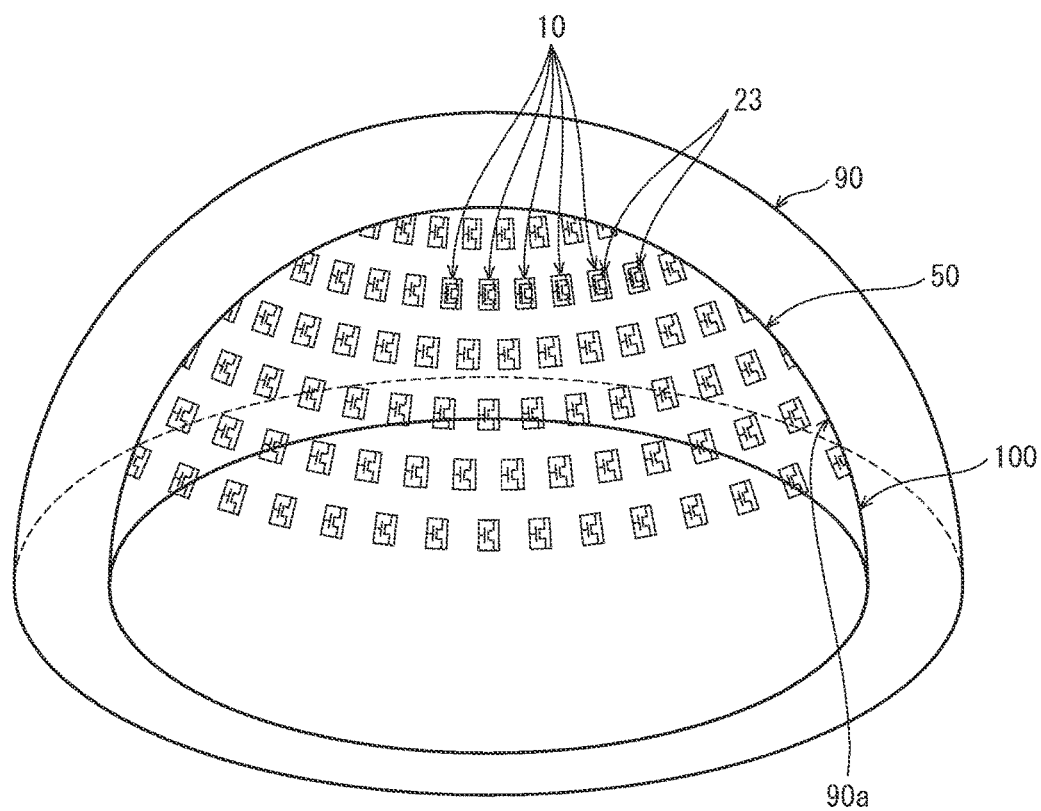
FIG. 3 is a perspective view schematically illustrating an external appearance of the organic EL display device 1.
Figure 4:
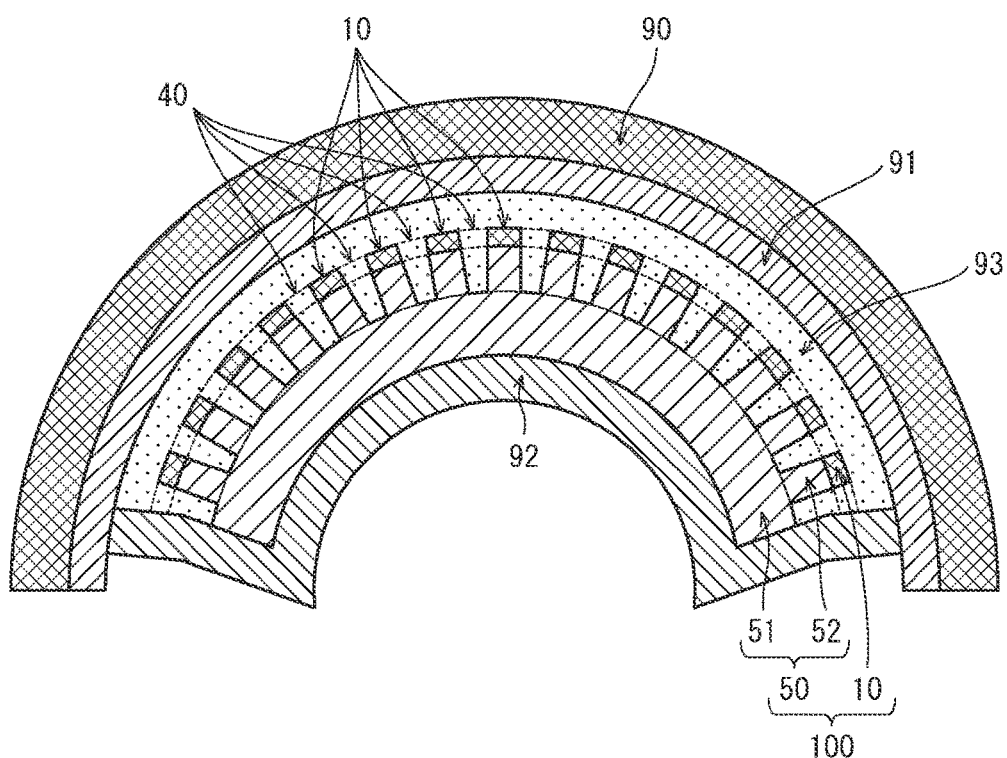
FIG. 4 is a side sectional view of the organic EL display device 1.

The following describes an overall structure of the display device 1, with reference to FIG. 3 and FIG. 4. FIG. 3 is a perspective view schematically illustrating an external appearance of the display device 1.

As illustrated in FIG. 3, the display device 1 is a curved display including the display panel 100 and a receiving substrate 90. The receiving substrate 90 has a curved surface shape, and the display panel 100 is attached to the receiving substrate 90. The display panel 100 includes a substrate 50 and the plurality of organic EL light-emitting elements 10 (hereinafter referred to as "light-emitting elements 10") arranged on the substrate 50.

The receiving substrate 90 is a member to which the display panel 100 is attached, and has a three-dimensionally curved surface shape. Here, the term "three-dimensionally curved surface" refers to a non-developable curved surface. The receiving substrate 90 is selected from members having a three-dimensionally curved surface shape, such as a window pane having a shape of a hemisphere or a semi-elliptical sphere, and a window, a windshield, or the like of a vehicle such as an airplane, a car, a motorcycle, or a ship. Alternatively, the receiving substrate 90 may be a structure having a portion with a three-dimensionally curved surface shape. The receiving substrate 90 may be light-transmissive and made of, for example, glass or a light-transmissive resin. Alternatively, the receiving substrate may be light-shielding and made of, for example, a metal or a non-transparent resin.

The present embodiment describes a specific example of the display panel 100 illustrated in FIG. 3. Here, the receiving substrate 90 is a hemispherical and light-transmissive member. The display panel 100 is adhered to an inner surface 90a of the receiving substrate 90, so that the display panel 100 is along the curved surface shape of the receiving substrate 90 and the plurality of light-emitting elements 10 are distributed in a substantially uniform manner above the inner surface 90a of the receiving substrate 90. Each of the light-emitting elements 10 forms a pixel 23, and each pixel 23 includes three subpixels (not illustrated) each emitting light of a different one of three colors red (R), green (G), and blue (B). This structure enables visual recognition, through the receiving substrate 90, of an image displayed by the plurality of pixels 23.

FIG. 4 is a side sectional view of the display device 1. As illustrated in FIG. 4, in the display panel 100, the plurality of light-emitting elements 10 are arranged on the substrate 50 having a sheet-like shape so that the light-emitting elements 10 are distributed in a substantially uniform manner above the inner surface 90a of the receiving substrate 90. Further, the display panel 100 includes a plurality of wire units 40 each of which establishing electrical connection between the light-emitting elements 10. Meanwhile, a sealing layer 91 is on the inner surface 90a of the receiving substrate 90. The display device 1 has a structure in which a display surface of the display panel 100 is adhered onto the sealing layer 91 via an adhesion layer 93, and a sealing layer 92 covers a rear surface of the display panel 100. Here, the term "display surface" refers to a surface of the display panel 100 at which the light-emitting elements 10 are existent, and the term "rear surface" refers to a surface of the display panel 100 opposite the display surface.

The substrate 50 is a film made of a flexible material and supports the display panel 100. The substrate 50 has a first layer 51 that is located close to the rear surface of the display panel 100 and a second layer 52 that is located close to the display surface of the display panel 100. The second layer 52 has smaller stiffness than the first layer 51. Because of the above-described structure, the substrate 50 has great overall flexibility. Details of the substrate 50 are described later.

The adhesion layer 93 has the functions of cancelling out a difference of surface shapes of the display panel 100 and the receiving substrate 90 and adhering the display panel 100 and the receiving substrate 90. For example, the adhesion layer 93 is made of a material such as a resin adhesive. The adhesion layer 93 may be made of a light-transmissive resin such as an acrylic resin, a silicone resin, or an epoxy resin.

The sealing layer 91 and the sealing layer 92 have a function of preventing the display panel 100 and the adhesion layer 93 from being exposed to moisture, air, or the like. The sealing layer 91 and the sealing layer 92 are made of a light-transmissive material such as silicon nitride (SiN) or silicon oxynitride (SiON). Further, a sealing resin layer made of a resin such as an acrylic resin or a silicone resin may be disposed on/instead of a layer made of a light-transmissive material such as silicon nitride (SiN) or silicon oxynitride (SiON).

3. Structure of Display Panel 100

3.1 Overall Structure of Display Panel 100

The display panel 100 is described with reference to the drawings. Note that the drawings are schematic and may not represent the same scale as actual display panels 100.

Figure 5:
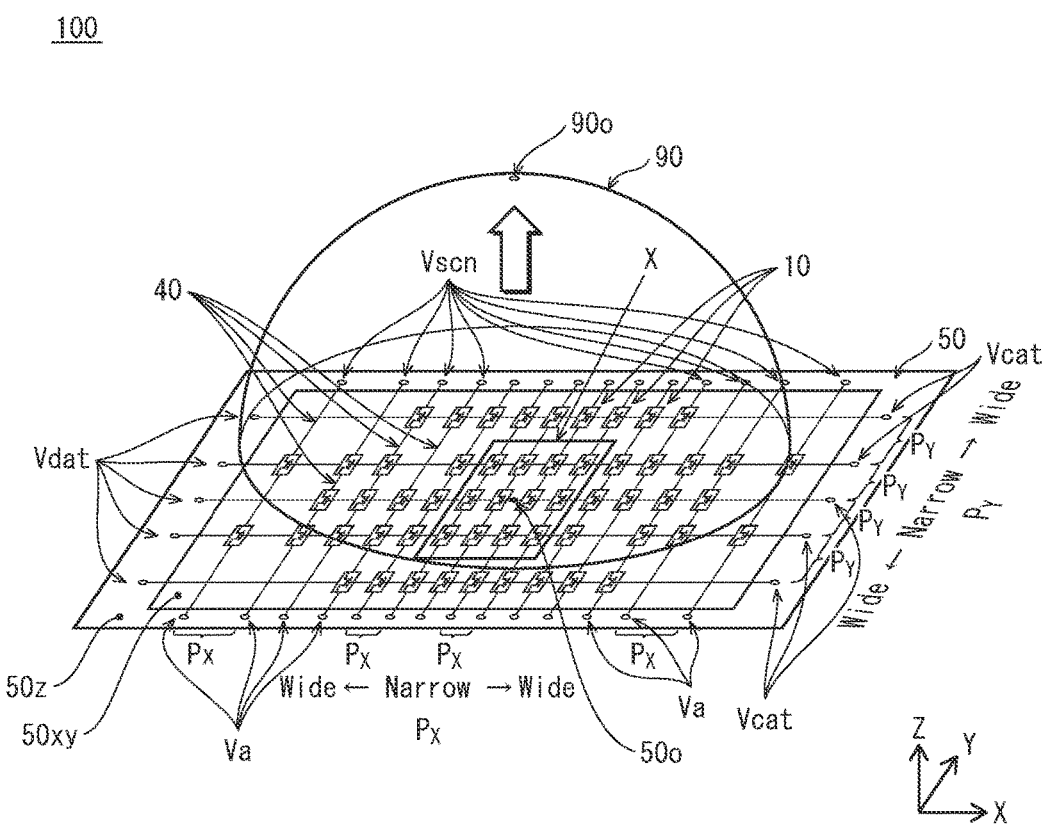
FIG. 5 is a perspective view schematically illustrating an external appearance of the organic EL display panel 100.

FIG. 5 is a perspective view schematically illustrating an external appearance of the display panel 100. Specifically, FIG. 5 schematically illustrates an external appearance of the display panel 100 before being attached to the receiving substrate 90.

As illustrated in FIG. 5, in the display panel 100, the plurality of light-emitting elements 10 are arranged on the sheet-like substrate 50. The plurality of wire units 40 establish electrical connection between the light-emitting elements 10. A region of the substrate 50 at which the light-emitting elements 10 are existent serves as a display region 50xy of the display panel 100, and a region of the substrate 50 surrounding the display region 50xy serves as a peripheral region 50Z of the substrate 50.

As described above, in the display panel 100, the plurality of light-emitting elements 10 are arranged on the sheet-like substrate 50 so that, when the display panel 100 is attached to the receiving substrate 90, the light-emitting elements 10 are distributed in a substantially uniform manner above the inner surface 90a of the receiving substrate 90. In order to achieve this, in the display panel 100 before being attached to the receiving substrate 90, the closer light-emitting elements 10 are to the peripheral region 50Z of the substrate 50, the wider a pitch $P_X$ between light-emitting elements 10 in an X-direction and a pitch $P_Y$ between light-emitting elements 10 in a Y-direction are. That is, the closer light-emitting elements 10 are to a center 50o of the substrate 50 that is to be attached to a center 90o of the receiving substrate 90, the narrower the pitch $P_X$ and the pitch $P_Y$ are. It is preferable that the pitch $P_X$ and the pitch $P_Y$ between organic light-emitting elements 10 be adjusted as necessary in accordance with the curved surface shape of the inner surface of 90a of the receiving substrate 90. Because a distance between light-emitting elements 10 changes in accordance with a pitch between light-emitting elements 10, the above-described structure ensures substantially uniform distribution of the plurality of light-emitting elements 10 above inner surfaces 90a of receiving substrates 90 of various different shapes.

The wire units 40 extend from the light-emitting elements 10 to the peripheral region 50Z of the substrate 50. In the peripheral region 50Z, a set of input terminals of the data lines Vdat, a set of input terminals of the scanning lines Vscn, a set of terminals of the ground lines Vcat, and a set of terminals of the power source lines Va are each disposed in proximity of a different one of the four sides of the substrate 50.

3.2 Overview of Light-Emitting Elements 10, Wire Units 40, and Substrate 50

Figure 6A:
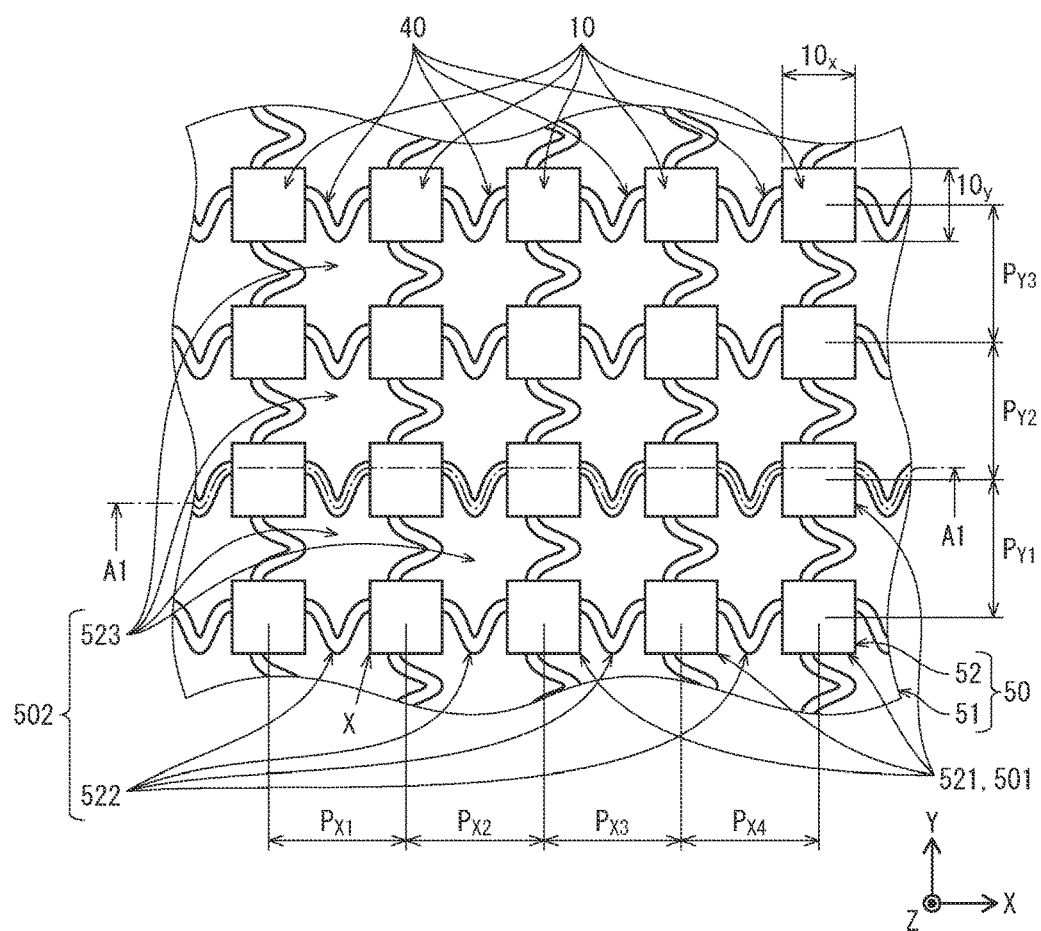
FIG. 6A is an enlarged plan view of portion X in FIG. 5.
Figure 6B:
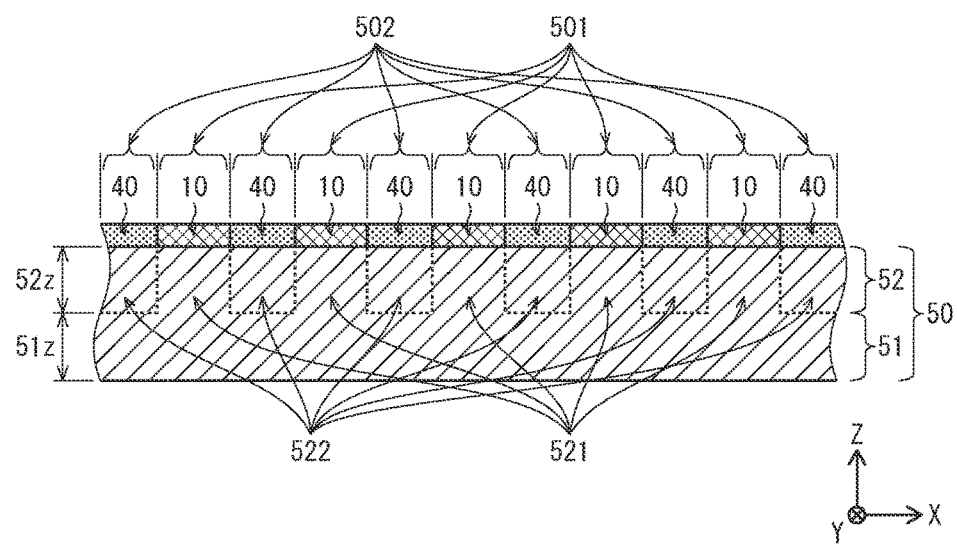
FIG. 6B is a cross-sectional view taken along line A1-A1 in FIG. 6A.
Figure 7:
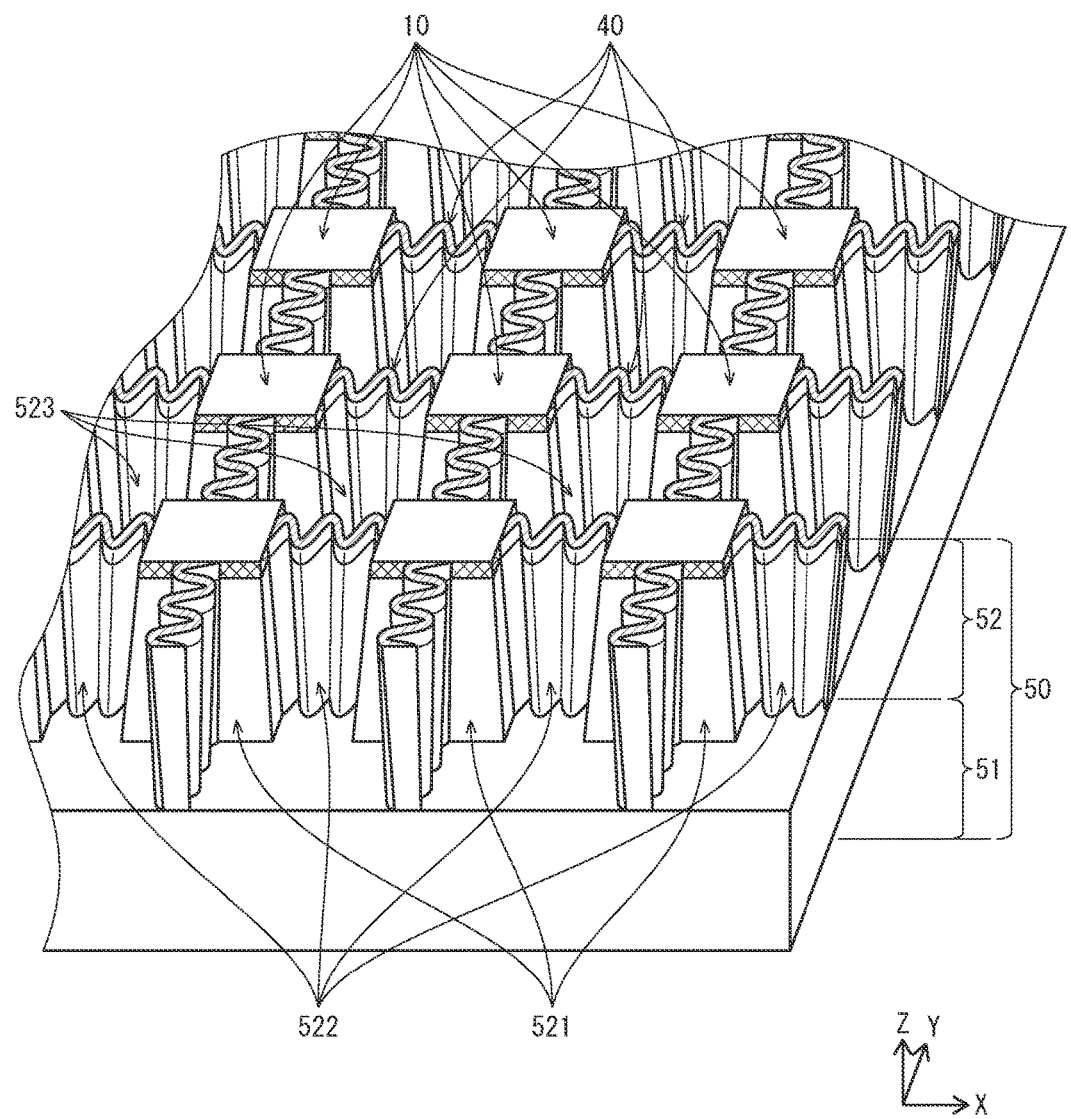
FIG. 7 is an enlarged perspective view schematically illustrating a portion of a display surface of the organic EL display panel 100.

An overview of the light-emitting elements 10 and the wire units 40 on the substrate 50 in the display panel 100 is described with reference to the drawings. FIG. 6A is an enlarged plan view of portion X in FIG. 5, and FIG. 6B is a cross-sectional view taken along line A1-A1 in FIG. 6A. FIG. 7 is an enlarged perspective view schematically illustrating a portion of the display surface of the organic EL display panel 100.

The substrate 50 is a film made of a flexible material. The substrate 50 may be formed by using an electrically-insulating material such as a resin. As illustrated in FIG. 6B, the substrate 50 has the first layer 51, which is located close to the rear surface of the display panel 100, and the second layer 52, which is located close to the display surface of the display panel 100. The first layer 51 and the second layer 52 are made of the same resin and are continuous with each other. The entirety of the first layer 51 is made of the same resin continuing in the entire substrate 50. Meanwhile, on the first layer 51, the second layer 52 has a plurality of solid portions 521 and a plurality of fence portions 522 as illustrated in FIG. 6A and FIG. 7. The solid portions 521 have a three-dimensional shape and are spaced away from each other. Here, a pitch $P_{Xi}$ is used to refer to the variable pitch $P_X$ between the solid portions 521 in the X-direction, and a pitch $P_{Yj}$ is used to refer to the pitch $P_Y$ between the solid portions 521 in the Y-direction (i and j each indicate a natural number). The fence portions 522 have a plate-like shape or a corrugated plate-like shape and connect the solid portions 521.

Solid portions 521 and fence portions 522 connecting the solid portions 521 surround an opening 523. Because the second layer 52 has a plurality of openings 523, regions of the substrate 50 where the solid portions 521 are present, which form a first region 501, have greater stiffness than regions of the substrate 50 where the fence portions 522 and the openings 523 are present (that is, the regions of the substrate 50 where the solid portions 521 do not exist), which form a second region 502. Due to including the second layer 52, the substrate 50 has great overall flexibility.

In the substrate 50, the light-emitting elements 10 are disposed with respect to the first region 501, or more specifically, on upper surfaces of the solid portions 521. Thus, great stiffness of the solid portions 521 prevents deformation of the light-emitting elements 10.

Meanwhile, due to having small stiffness, the second region 502 deforms easily. This characteristic of the second region 502 contributes to great overall flexibility of the substrate 50. When the second region 502 deforms, the plate-like shape or corrugated plate-like shape of the fence portions 522 enables the fence portions 522 to deform in accordance with deformation of the second region 502. The wire units 40, which electrically connect the light-emitting elements 10, are disposed with respect to the second region 502, or more specifically, on upper surfaces of the fence portions 522. The plurality of light-emitting elements 10 and the plurality of wire units 40 form the display region 50xy of the display panel 100.

Meanwhile, when the first layer 51 and the second layer 52 are made of the same material as described above, the second layer 52 is sufficient as long as at least a portion of the second region 502 has a corrugated plate-like shape. However, the second layer 52 and the first layer 51 may be made of different materials. Specifically, the second layer 52 may be made of a material having greater stiffness than the material forming the first layer 51 so that the first layer 51 has a greater stretchability than the second layer 52.

As illustrated in FIG. 6A, the plurality of light-emitting elements 10 are arranged on the sheet-like substrate 50 at the predetermined pitches $P_X$ and $P_Y$, and the wire units 40 connect the light-emitting elements 10.

A thickness $51z$ of the first layer 51, a thickness $52z$ of the second layer 52, a length $10x$ of the solid portions 521, a length $10y$ of the solid portions 521 in the Y-direction, the pitch $P_{Xi}$ between the solid portions 521, and the pitch $P_{Yj}$ between the solid portions may be adjusted as necessary in accordance with the specification of the substrate 50, such as stiffness of the resin material forming the substrate 50, and overall flexibility, luminance, and the like that the substrate 50 needs to achieve. For example, the ratio of the thickness $51z$ to the thickness $52z$ may be from 1:0.8 to 1:1.2. The ratio of the length $10x$ to the minimum value of the pitch $P_{Xi}$ may be 0.5 or less, and the ratio of the length $10y$ to the minimum value of the pitch $P_{Yj}$ may be 0.5 or less. In the present embodiment, the thickness $51z$ and the thickness $52z$ are set to about 50 μm. The minimum value of the length $10x$ and the minimum value of the length $10y$ are set to about 100 μm, and the minimum value of the pitch $P_{Xi}$ and the minimum value of the pitch $P_{Yj}$ are set to about 50 μm. It is preferable that the stiffness of the first region 501 is five times or greater than the stiffness of the second region 502.

3.3 Details of Light-Emitting Elements 10, Wire Units 40, and Substrate 50

<Overview of Structure of Light-Emitting Elements 10>

Figure 8:
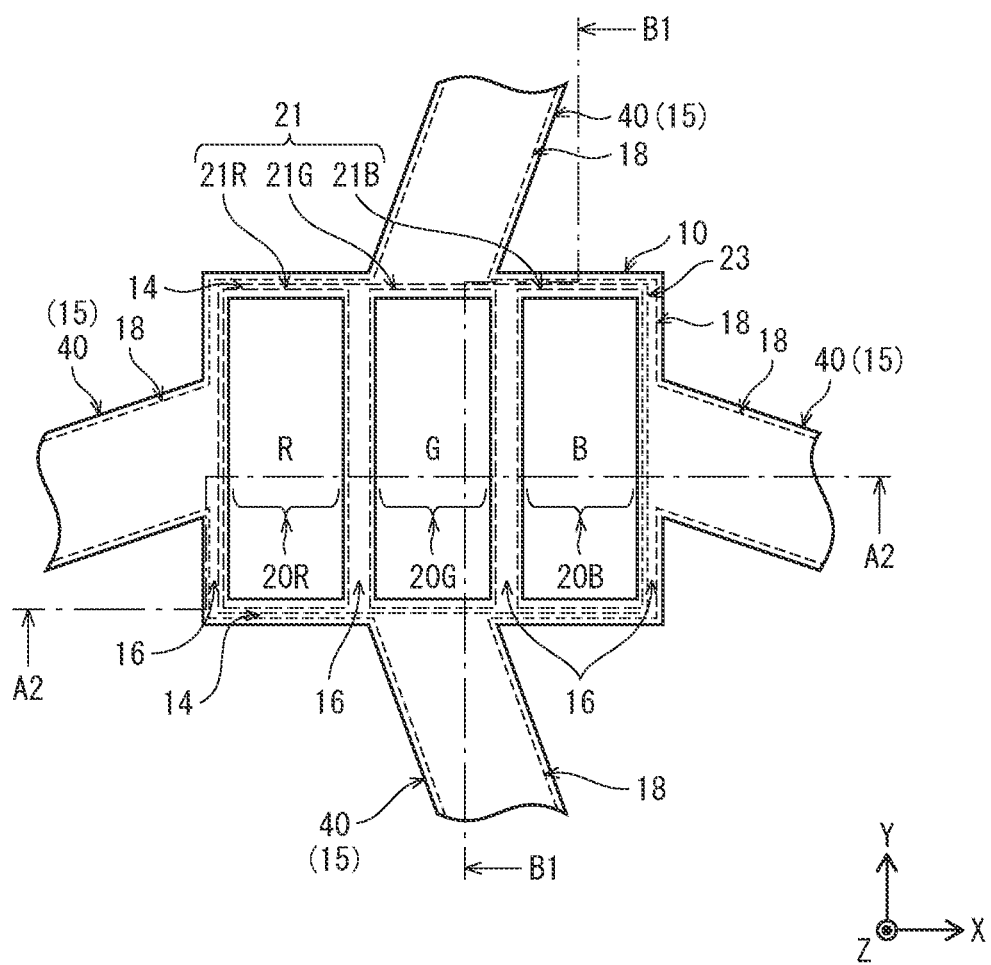
FIG. 8 is a plan view of a light-emitting element 10 and wire units 40 on the display panel 100.
Figure 9:
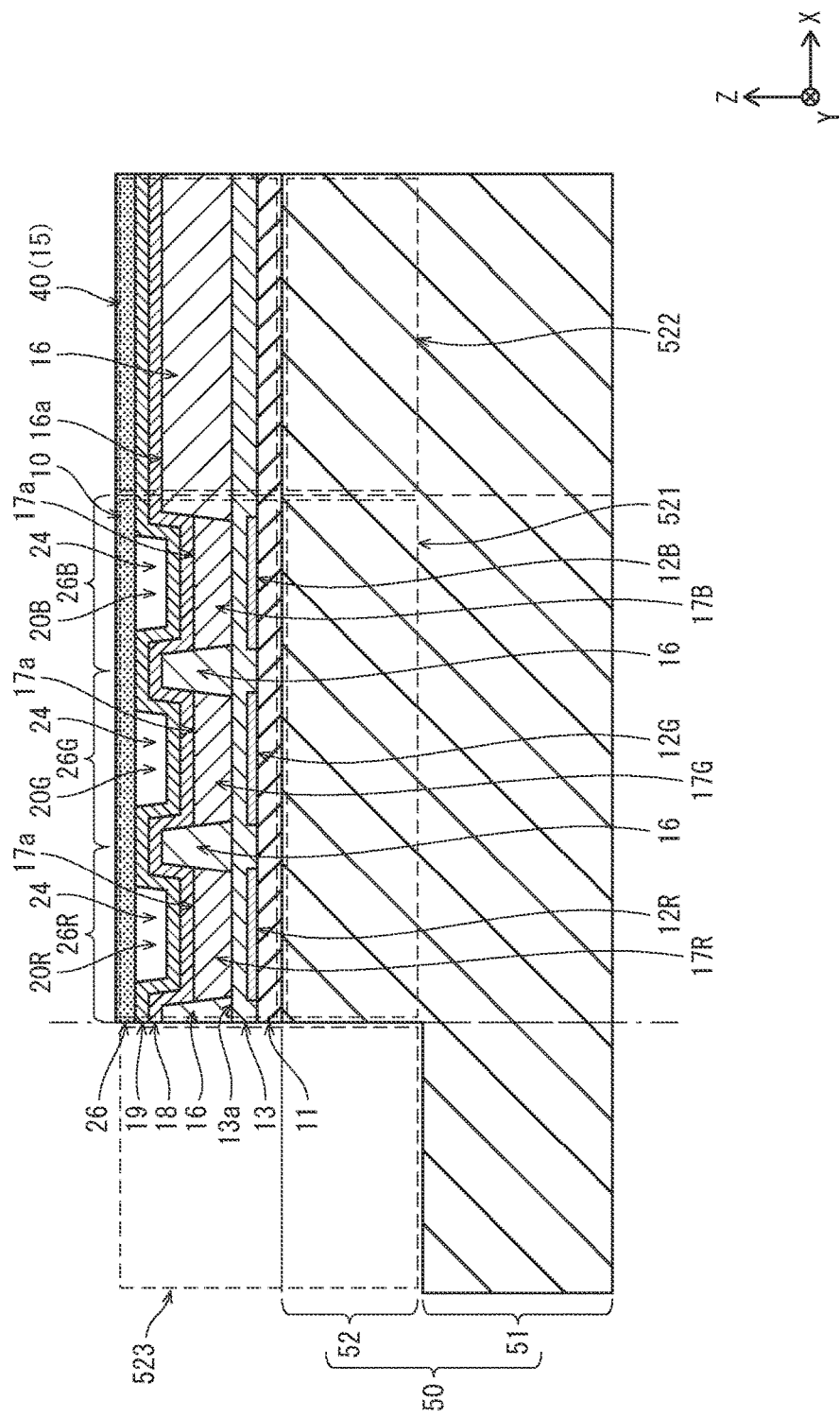
FIG. 9 is a cross-sectional view taken along line A2-A2 in FIG. 8.
Figure 10:
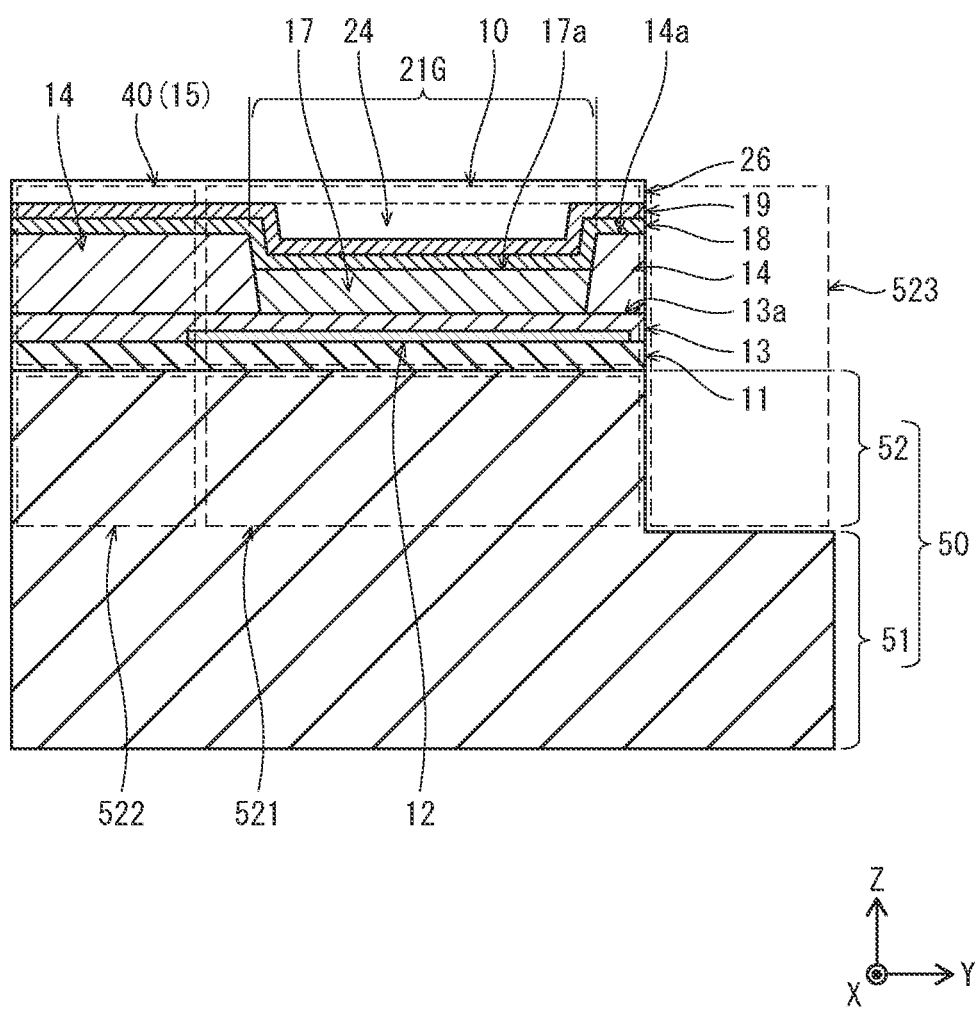
FIG. 10 is a cross-sectional view taken along line B1-B1 in FIG. 8.

Details of the light-emitting elements 10 and the wire units 40 in the display panel 100 are described with reference to the drawings. FIG. 8 is a plan view of wire units 40 and one light-emitting element 10 forming one pixel 23, on the display panel 100. FIG. 9 is a cross-sectional view taken along line A2-A2 in FIG. 8. FIG. 10 is a cross-sectional view taken along line B1-B1 in FIG. 8.

The light-emitting element 10 makes use of an electroluminescent phenomenon of an organic compound. As an example, the light-emitting element 10 is a top-emission type light-emitting element having a display surface in a Z-direction in the drawings. In the following, a direction toward an upper portion of the light-emitting element 10 is described as the Z-direction.

As illustrated in FIG. 9 and FIG. 10, the substrate 50 has the first layer 51 and the second layer 52 in a thickness direction of the substrate 50. The second layer 52 includes a solid portion 521, fence portions 522, and openings 523. The light-emitting element 10 is disposed on the solid portion 521, and the wire units 40 are disposed on the fence portions 522.

As illustrated in the plan view of FIG. 8, the light-emitting element 10 has pixel banks. In the present embodiment, subpixels 21 of the light-emitting element 10 include a red subpixel 21R emitting red light, a green subpixel 21G emitting green light, and a blue subpixel 21B emitting blue light (in the following, whenever it is unnecessary to distinguish the red subpixel 21R, the green subpixel 21G, and the blue subpixel 21B from one another, they are referred to as "subpixels 21"). Further, the light-emitting element 10 has a red gap 20R in which the red subpixel 21R is disposed, a green gap 20G in which the green subpixel 21G is disposed, and a blue gap 20B in which the blue subpixel 21B is disposed (whenever it is unnecessary to distinguish the red gap 20R, the green gap 20G, and the blue gap 20B from each other, they are referred to as "gaps 20"). The red subpixel 21R, the green subpixel 21G, and the blue subpixel 21B are arrayed side-by-side in a row direction (i.e. the X-direction) and form one pixel 23.

An outer boundary of each subpixel 21 in a column direction (orthogonal to the row direction; i.e. the Y-direction) is defined by a short side pixel bank 14 described later. The short side pixel bank 14 has the same column direction position in all of the subpixels 21. An outer boundary of each subpixel 21 in the row direction is defined by a long side pixel bank 16 described later.

A counter electrode 18 extends through the light-emitting element 10, and extends out from boundaries of the light-emitting element 10 in both the X-direction and the Y-direction.

<Structure of Components>

In the display panel 100, the light-emitting element 10 and the wire units 40 are disposed on the substrate 50. The light-emitting element 10 includes a thin film transistor (TFT) layer 11, pixel electrodes 12, a base layer 13, short side pixel banks 14, long side pixel banks 16, light-emitting layers 17, a counter electrode 18, a sealing layer 19, adhesion layers 24, and a color filter substrate 26. Each of the wire units 40 includes the TFT layer 11, the base layer 13, one of a short side pixel bank 14 or a long side pixel bank 16, the counter electrode 18, and the sealing layer 19.

The following describes structures of each component, with reference to FIG. 9 and FIG. 10.

(1) Substrate 50

The substrate 50 is a film made of a flexible material and supports the light-emitting element 10. The substrate 50 may be formed by using an electrically-insulating material such as a resin. Specifically, the substrate 50 may be formed by using: polyimide, polyimidebenzoxazole, polyimidebenzimidazole, or other copolymers containing polyimide as a unit structure; polyolefin such as polyester, polytetrafluoroethylene, polyphenylene sulfide, polyamide, polyamideimide, polycarbonate, polystyrene, polypropylene, polyethylene, polyvinyl chloride, polyether sulfone, polyethylene naphthalene, ethylene-propylene copolymer, ethylene-vinyl acetate copolymer; cyclic polyolefin; modified polyolefin; polyvinyl chloride; polyvinylidene chloride; an acrylic resin; polymethyl methacrylate; acrylic-styrene copolymer; butadiene-styrene copolymer; ethylene vinyl alcohol copolymer; polyether; polyether ketone; polyetherehterketone; polyether imide; polyacetal; polyphenylene oxide; modified polyphenylene oxide; polyarylate; aromatic polyester; or polyvinylidene fluoride. The substrate 50 may have a multilayered structure of layers each including one or more of the above-described materials.

(2) TFT Layer 11

The TFT layer 11 includes a first sealing layer, a TFT circuit on the first sealing layer, and an interlayer electrically-insulating layer on the first sealing layer and the TFT circuit. These components of the TFT layer 11 are not illustrated in the drawings.

The first sealing layer is made of an inorganic material having a gas barrier property. The first sealing layer may be formed by using silicon oxide, silicon nitride, silicon oxynitride, or aluminum oxide.

The TFT circuit includes a plurality of TFTs and wires on an upper surface of the first sealing layer. Each of the TFTs electrically connects a corresponding one of the pixel electrodes 12 and an external power source, in accordance with a drive signal from an external circuit of the light-emitting element 10. Each of the TFTs has a multilayered structure including, for example, an electrode, a semiconductor layer, and an electrically-insulating layer. The wires electrically connect components such as the TFTs, the pixel electrodes 12, the external power source, and the external circuit.

The interlayer electrically-insulating layer, by cancelling out level differences formed by the TFTs at least where the subpixels 21 are to be disposed, ensures that an upper surface of the TFT layer is flat. Further, the interlayer electrically-insulating layer fills gaps between the wires and the TFTs and electrically insulates the wires and the TFTs from one another. For example, the interlayer electrically-insulating layer is formed by using a positive photosensitive organic material having an electrically-insulating property. Specifically, an acrylic resin, a polyimide resin, a siloxane resin, a phenolic resin, or the like may be used.

The TFT layer 11 extends from the light-emitting element 10 to adjacent light-emitting elements 10, along the wire units 40 extending out from the light-emitting element 10 in the X-direction and the Y-direction.

(3) Pixel Electrodes 12

The pixel electrodes 12 are above the substrate 50 and include a pixel electrode 12R included in the red subpixel 21R, a pixel electrode 12G included in the green subpixel 21G, and a pixel electrode 21B included in the blue subpixel 21B (whenever it is unnecessary to distinguish the pixel electrode 12R, the pixel electrode 12G, and the pixel electrode 12B from one another, they are referred to as "pixel electrodes 12"). The pixel electrodes 12 supply carriers to the light-emitting layers 17. For example, when the pixel electrodes 12 function as anodes, the pixel electrodes 12 supply holes to the light-emitting layers 17. Typically, the pixel electrodes 12 have a plate-like shape. However, when the pixel electrodes 12 connect to the TFTs via contact holes in the interlayer electrically-insulating layer, the pixel electrodes have convexes and recesses corresponding to the contact holes. The pixel electrodes 12 are disposed in the gaps 20 in one-to-one correspondence above the substrate 50 and on the TFT layer 11, and are spaced away from each other in the column direction.

Because the light-emitting element 10 is a top-emission type light-emitting element, it is preferable that the pixel electrodes 12 be formed by using an electrically-conductive material having light-reflectivity. For example, a metal such as silver, aluminum, or molybdenum, or an alloy thereof may be used.

Further, between pixels that are adjacent in the row direction on the substrate 50, wire regions 15 of a signal line or a power source line that are parallel with one another extend in the column direction in the wire units 40 across the entirety of the light-emitting element 10. The wire regions 15 electrically connect to the counter electrode 18 via the base layer 13. The wire regions 15 are made of the same material as the pixel electrodes 12.

(4) Base Layer 13

For example, the base layer 13 in the present embodiment is a hole injection layer, and is formed as a solid film that is continuous above the pixel electrodes 12. Forming the base layer 13 as a continuous solid film in this manner simplifies the manufacturing of the base layer 13.

Further, the base layer 13 is made of a transition metal oxide and functions as a hole injection layer. Here, the term "transition metal" refers to elements belonging to any group between group III and group XI in the periodic table. Among transition metals, metals such as tungsten, molybdenum, nickel, titanium, vanadium, chromium, manganese, iron, cobalt, niobium, hafnium, and tantalum are preferable because these metals have a great hole injection property after being oxidized. Tungsten is particularly advantageous for forming a hole injection layer with a great hole injection property. Meanwhile, the base layer 13 is not limited to a layer made of a transition metal oxide. For example, the base layer 13 may be made of an oxide of a transition metal alloy. Further, the base layer 13 is not limited to a hole injection layer, and may be any layer between the pixel electrodes 12 and the light-emitting layers 17.

(5) Short Side Pixel Banks 14

The short side pixel banks 14 prevent inks containing an organic compound for forming the light-emitting layers 17 from flowing in the column direction in the gaps 20. Each short side pixel bank 14 is disposed above a column-direction peripheral region of a pixel electrode 12, and overlaps with a portion of the pixel electrode 12. Accordingly, as described above, the short side pixel banks 14 define outer boundaries in the column direction of the subpixels 21 of different colors. The short side pixel banks 14 have a line shape extending in the row direction, and the short side pixel banks 14 have a forward taper cross-sectional shape (taper shape with a narrower upper portion than a lower portion). The short side pixel banks 14 are disposed in the row direction, so as to intersect with the long side pixel banks 16. The short side pixel banks 14 have upper surfaces 14a at the same height as upper surfaces 16a of the long side pixel banks 16.

The short side pixel banks 14 may be formed by using an electrically-insulating material. For example, an organic material such as silicon oxide or silicon nitride, or an organic material such as an acrylic resin, a polyimide resin, a siloxane resin, or a phenolic resin may be used.

Further, between pixels that are adjacent in the column direction on the substrate 50, wire regions 15 of a signal line or a power source line that are parallel with one another extend in the row direction in the wire units 40 across the entirety of the light-emitting element 10.

(6) Long Side Pixel Banks 16

The long side pixel banks 16 prevent the inks for forming the light-emitting layers 17 from flowing in the row direction in the gaps 20. Each long side pixel bank 16 is disposed above a row-direction peripheral portion of a pixel electrode 12, and overlaps with a portion of the pixel electrode 12. Accordingly, as described above, the long side pixel banks 16 define outer boundaries in the row direction of the subpixels 21 of different colors. The long side pixel banks 16 have a line shape extending in the column direction, and the long side pixel banks 16 have a forward taper cross-sectional shape (taper shape with a narrower upper portion than a lower portion). The long side pixel banks 16 are disposed on the base layer 13 so as to sandwich each of the pixel electrodes 12 from the row direction and so as to intersect with the short side pixel banks 14.

For example, the long side pixel banks 16 may be formed by using an organic material such as an acrylic resin, a polyimide resin, a siloxane resin, or a phenolic resin. It is preferable that the long side pixel banks 16 be formed by using a material which has resistance against organic solvents and is not excessively deformed and/or deteriorated through etching and baking. Further, a fluorine treatment may be applied so as to impart liquid repellency to surfaces of the long side pixel banks 16.

Further, as described above, between pixels that are adjacent in the row direction on the substrate 50, the wire regions 15 of a signal line or a power source line, which are parallel with one another, extend in the column direction in the wire units 40 across the entirety of the light-emitting element 10.

(7) Light-Emitting Layers 17

A red organic light-emitting layer 17R, a green organic light-emitting layer 17G, and a blue organic light-emitting layer 17B (whenever it is unnecessary to distinguish the red organic light-emitting layer 17R, the green organic light-emitting layer 17G, and the blue organic light-emitting layer 17B, from one another, these layers are referred to as the "light-emitting layers 17") are in the gaps 20 surrounded by adjacent long side pixel banks 16 and adjacent short side pixel banks 14. The red organic light-emitting layer 17R, the green organic light-emitting layer 17G, and the blue organic light-emitting layer 17B are arrayed in this order in the row direction above the substrate 50. The light-emitting layers 17 are made of an organic compound, and have a function of emitting light when holes and electrons recombine in the light-emitting layers 17. The light-emitting layers 17 extend linearly in the column direction in the gaps 20. In the subpixels 21, the light-emitting layers 17 are disposed on an upper surface 13a of the base layer 13.

Here, light is emitted from only portions of the light-emitting layers 17 to which carriers are supplied from the pixel electrodes 12. Accordingly, the light-emitting layers 17 emit light from only portions in the subpixels 21 above the pixel electrodes 12, as illustrated in FIG. 8.

The light-emitting layers 17 are formed by using a luminescent organic material which can form a film through a wet process. Specifically, for example, a known fluorescent material or a known phosphorescent material, such as a compound, a derivative, or a complex of a fluorescent material such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, a metal complex of oxine, or a rare earth metal complex (described in Japanese Patent Application Publication No. H5-163488f) may be used.

(8) Counter Electrode 18

The counter electrode 18 is above the red organic light-emitting layer 17R, the green organic light-emitting layer 17G, and the blue organic light-emitting layer 17B so as to face the pixel electrode 12R in the red subpixel 21R, the pixel electrode 12G in the green subpixel 21G, and the pixel electrode 12B in the blue subpixel 21B. The counter electrode 18 extends from the light-emitting element 10 to adjacent light-emitting elements 10, along the wire units 40 extending out from of the light-emitting element 10 in the X-direction and the Y-direction.

The counter electrode 18 is paired with each pixel electrode 12 with a light-emitting layer 17 therebetween. Thus, the counter electrode 18 forms electricity conducting paths and supplies carriers to the light-emitting layers 17. For example, when the counter electrode 18 functions as a cathode, the counter electrode 18 supplies electrons to the light-emitting layers 17. The counter electrode 18 is a common electrode that is continuous over the light-emitting layers 17, and is disposed along upper surfaces 17a of the light-emitting layers 17 and surfaces of the long side pixel banks 16 and the short side pixel banks 14 exposed around the light-emitting layers 17.

Because the light-emitting element 10 is a top-emission type light-emitting element, the counter electrode 18 is made of an electrically conductive material having light transmittance. For example, indium tin oxide (ITO) or indium zinc oxide (IZO) may be used.

The counter electrode 18 electrically connects to the wire regions 15 in the wire units 40. As described above, the wire regions 15 are parallel with each other and extend in the column direction between pixels that are adjacent in the row direction on the substrate 50.

(9) Sealing Layer 19

The sealing layer 19 prevents the light-emitting layers 17 from contacting moisture, air, or the like and deteriorating. The sealing layer 19 covers an upper surface of the counter electrode 18 and extends over the entirety of the organic light-emitting element 10 and the wire units 40. The sealing layer 19 is made of an inorganic material having a gas barrier property. Because the light-emitting element 10 is a top-emission type light-emitting element, the sealing layer 19 is made of an electrically conductive material having light transmittance, such as silicon oxide, silicon nitride, silicon oxynitride, or aluminum oxide.

(10) Adhesion Layers 24

The adhesion layers 24 are made of a material for adhering the sealing layer 19 and a color filter substrate 26. For example, the adhesion layers 24 may be made of an acrylic resin.

(11) Color Filter Substrate

As illustrated in FIG. 9 and FIG. 10, the color filter substrate 26, an upper substrate, and the like may be disposed and adhered onto the sealing layer 19 so as to cover the entire light-emitting element 10. This achieves, for example, adjustment of the display color, improvement of stiffness, and prevention of invasion of moisture, air, or the like.

The color filter substrate 26 is a film made of a flexible material. The color filter substrate 26 may be made by using the materials introduced as materials for forming the substrate 50.

The color filter substrate 26 includes a red filter 26R above the red gap 20R, in which the red subpixel 21R is formed, a green filter 26G above the green gap 20G, in which the green subpixel 21G is formed, and a blue filter 26B above the blue gap 20B, in which the blue subpixel 21B is formed.

The color filter 26R is a light-transmissive layer through which visible light with a wavelength corresponding to red (R) passes. Likewise, the color filter 26G is a light-transmissive layer through which visible light with a wavelength corresponding to green (G) passes, and the color filter 26B is a light-transmissive layer through which visible light with a wavelength corresponding to blue (B) passes. Each of the color filters 26R, 26G, and 26B has a function of correcting chromaticity of light emitted from the corresponding one of the subpixels. Specifically, the color filters 26G, 26R, and 26B each are formed through, for example, applying an ink containing a material for the color filter and a solvent onto cover glass for forming the color filter. The cover glass is provided with partition walls separating a plurality of openings corresponding one-to-one with the subpixels 21 and arrayed in a matrix.

4. Manufacturing Method 4.1 Method of Manufacturing Display Panel 100

A method of manufacturing the display panel 100 is described, with reference to FIG. 11A through FIG. 11D, FIG. 12A through FIG. 12D, and FIG. 13A through FIG. 13D. FIG. 11A through FIG. 11D, FIG. 12A through FIG. 12D, and FIG. 13A through FIG. 13D are cross-sectional views illustrating processes of manufacturing the display panel 100, each taken at a line corresponding to line A1-A1 in FIG. 8.

(1) Preparing Substrate 50

First, the TFT layer 11 is formed on the substrate 50. Specifically, for example, a film for the TFT layer 11 is first formed through performing a process such as sputtering, chemical vapor deposition (CVD), or spin coating to a base material. Second, the first sealing layer is formed by patterning the film through photolithography. Then, the TFT circuit is formed on the first sealing layer, and the interlayer electrically-insulating layer is formed on the first sealing layer and the TFT circuit. During forming the TFT layer, a process such as plasma treatment, ion injection, or baking may be performed as necessary.

(2) Forming Pixel Electrode 12

Then, the pixel electrodes 12 are formed on the substrate 50. Further, the wire regions 15 in the wire units 40 may be formed. Specifically, for example, a metal film is first formed on the substrate 50 through vacuum vapor deposition or sputtering. Then, the metal film is patterned through photolithography, and columns of a plurality of pixel electrodes 12 are arrayed in the row direction with gaps between one another. Further, a plurality of sets of such pixel electrodes 12 are disposed in parallel on the substrate 50. Thus, pixel electrodes 12 are arranged two-dimensionally on the substrate 50.

(3) Forming Base Layer 13

Figure 11A:
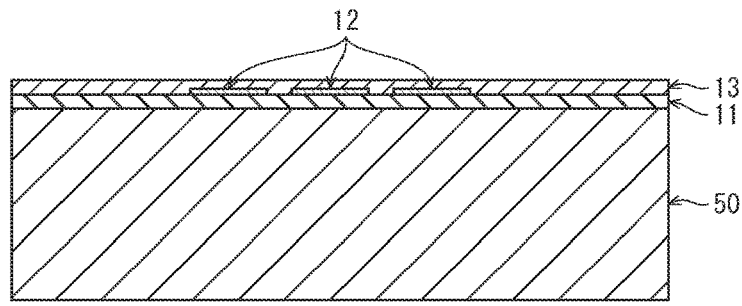
FIG. 11A through FIG. 11D are cross-sectional views illustrating processes of manufacturing the organic EL display panel 100, taken along a line corresponding to line A1-A1 in FIG. 8.

Then, as illustrated in FIG. 11A, the base layer 13 is formed on the substrate 50, on which the pixel electrodes 12 have been formed. Specifically, for example, an oxide layer in the form of a solid film is formed as the base layer 13 on the substrate 50 through sputtering, so as to cover all the pixel electrodes 12.

(4) Forming Pixel Banks 14 and 16

Figure 11B:
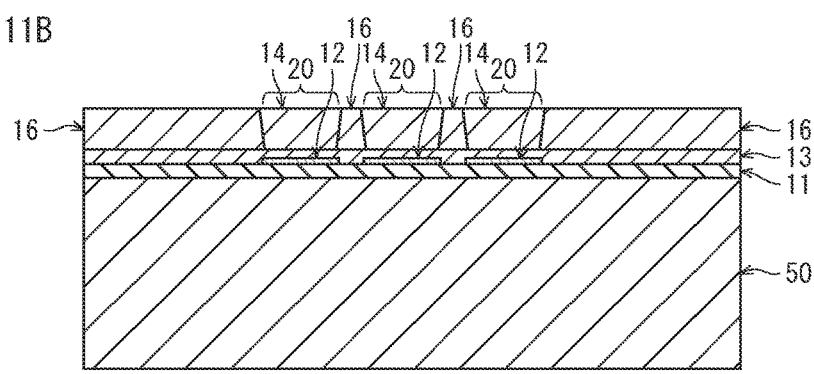

Then, the short side pixel banks 14 and the long side pixel banks 16 are formed on the base layer 13 as illustrated in FIG. 11B. Specifically, for example, a positive photosensitive organic material (such as an acrylic resin) is applied through spin coating. Here, the positive photosensitive organic material is applied so as to have a greater thickness than the short side pixel banks 14 and the long side pixel banks 16. Then, the short side pixel banks 14 extending linearly in the row direction and the long side pixel banks 16 extending linearly in the column direction are formed so as to sandwich each of the pixel electrodes 12, by patterning the photosensitive organic material through photolithography.

Note that the short side pixel banks 14 and the long side pixel banks 16 may be formed directly through a process such as printing. Further, a surface treatment may be performed to surfaces of the short side pixel banks 14 and the long side pixel banks 16 by using an alkaline solution, water, an organic solvent, plasma, or the like so as to impart liquid repellency against ink applied on the surfaces of the short side pixel banks 14 and the long side pixel banks 16 in processes performed afterwards. This prevents ink from flowing over the short side pixel banks 14 and the long side pixel banks 16 in the process for forming the light-emitting layers performed afterwards.

Meanwhile, the gaps 20, which are surrounded by adjacent long side pixel banks 16 and adjacent short side pixel banks 14, are formed through the process for forming the long side pixel banks 16 and the short side pixel banks 14. Thus, each subpixel 21 is located in one gap 20.

(5) Forming Light-Emitting Layers 17

Figure 11C:
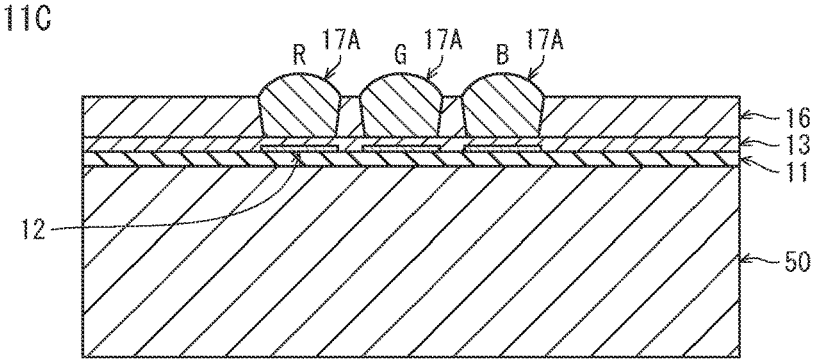

Next, inks 17A are applied into the gaps 20 as illustrated in FIG. 11C. Specifically, for example, each of the inks 17A is obtained through mixing an organic compound for forming the light-emitting layers 17 of a corresponding color and a solvent in a predetermined ratio. Then, the inks 17A are applied into the gaps 20 through printing. Then, the light-emitting layers 17 are formed through evaporating and drying the solvent in the inks 17A. Meanwhile, the inks 17A may be applied through a process such as a dispenser process, nozzle coating, spin coating, or an ink-jet process.

Further, because the subpixels 21 of the light-emitting layers 17 in the present embodiment correspond one-to-one to three colors red, green, and blue, the subpixels 21 with different colors are formed by using different inks 17A. Specifically, for example, each of the inks 17A may be applied by using a nozzle for the corresponding color. Alternatively, the inks 17A may be applied simultaneously by using a triple nozzle simultaneously ejecting the inks 17A of the three colors. In the display panel 100, it is preferable that the inks for forming the light-emitting layers of the three colors be made of the same material as one another. This achieves low cost because such inks can be applied simultaneously and the light-emitting layers 17 can be manufactured easily.

Alternatively, because the display panel 100 has pixel banks, it is preferable that the light-emitting layers 17 be formed by using a plurality of nozzles ejecting an ink 17A of the same color and arrayed in the column direction (or the row direction). The plurality of nozzles are moved in the row direction (or the column direction) intersecting the direction in which the plurality of nozzles are arrayed, and eject the ink 17A into the gaps 20, which are surrounded by the short side pixel banks 14 and the long side pixel banks 16. This achieves, firstly, a short time amount for application of the inks 17A, and therefore a short time amount for the manufacturing process, because a plurality of nozzles are used.

Figure 11D:
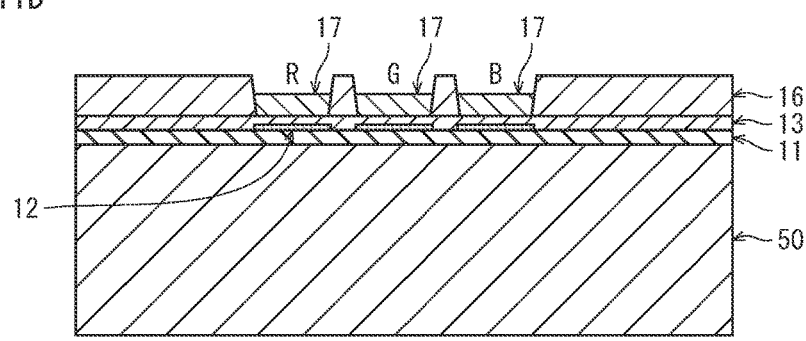

When the inks 17A after application dry, the light-emitting layers 17 are formed in the gaps 20 as illustrated in FIG. 11D. Forming the light-emitting layers 17 in the gaps 20 achieves forming the light-emitting layers 17 in the subpixels 21 each having a portion of the base layer 13 that is not covered by the short side pixel banks 14 and the long side pixel banks 16.

(6) Forming Counter Electrode 18

Figure 12A:
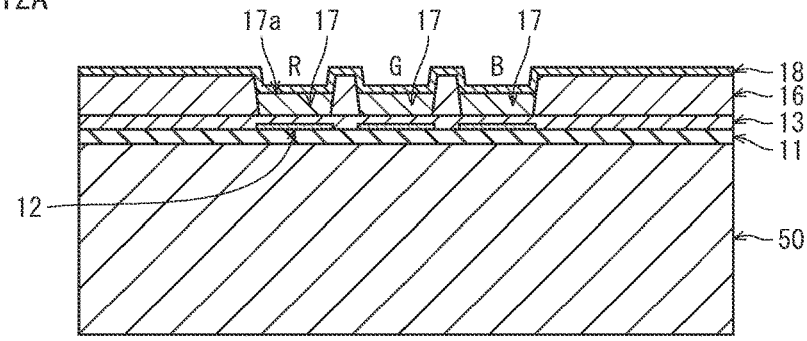
FIG. 12A through FIG. 12D are cross-sectional views illustrating processes of manufacturing the organic EL display panel 100, taken along a line corresponding to line A1-A1 in FIG. 8.

Then, the counter electrode 18 is formed so as to cover the upper surfaces 17a of the light-emitting layers 17 and surfaces of the short side pixel banks 14 and the long side pixel banks 16 exposed between the light-emitting layers 17, as illustrated in FIG. 12A. Specifically, for example, a film made of a light-transmissive electrically-conductive material such as ITO or IZO is formed through a process such as vacuum vapor deposition or sputtering, so as to cover the upper surfaces 17a of the light-emitting layers 17 and surfaces of the short side pixel banks 14 and the long side pixel banks 16 exposed between the light-emitting layers 17.

Here, the counter electrode 18 is electrically connected, via the base layer 13, to the wire regions 15, which are parallel with one another and extend in the column direction in the wire units 40 on the substrate 50.

(7) Forming Sealing Layer 19

Figure 12B:
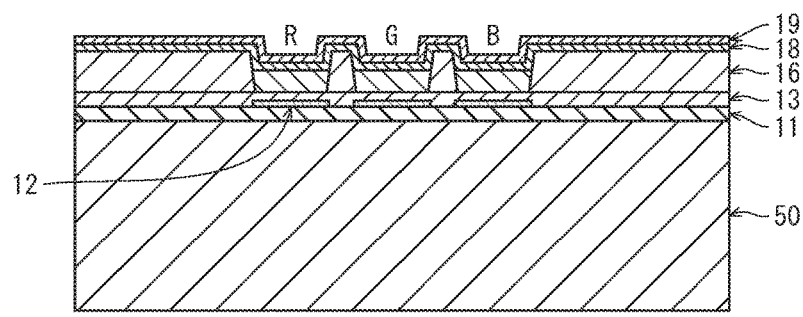

Next, the sealing layer 19, which covers the upper surface of the counter electrode 18, is formed as illustrated in FIG. 12B. Specifically, for example, a film of an electrically-insulating inorganic material (such as silicon oxide) is formed on the counter electrode 18 through sputtering or CVD.

(8) Adhering to Color Filter Substrate 26

Figure 12C:
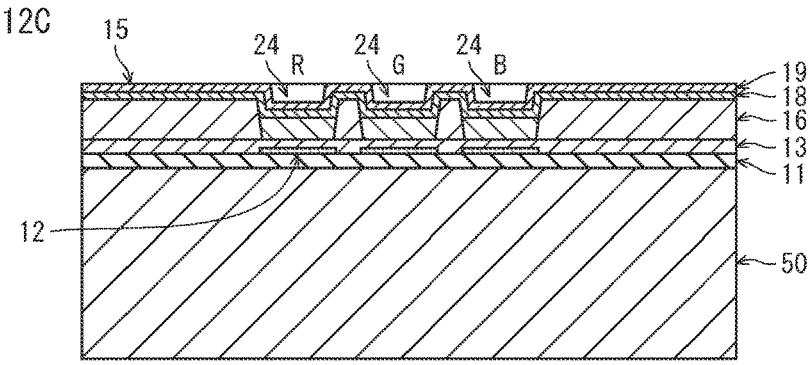

Next, a material for the adhesion layers 24 is applied to a panel made of layers up to the sealing layer 19 (FIG. 12C). The material for the adhesion layers 24 mainly contains a light-transmissive and ultraviolet curing resin such as an acrylic resin, a silicone resin, or an epoxy resin.

Figure 12D:
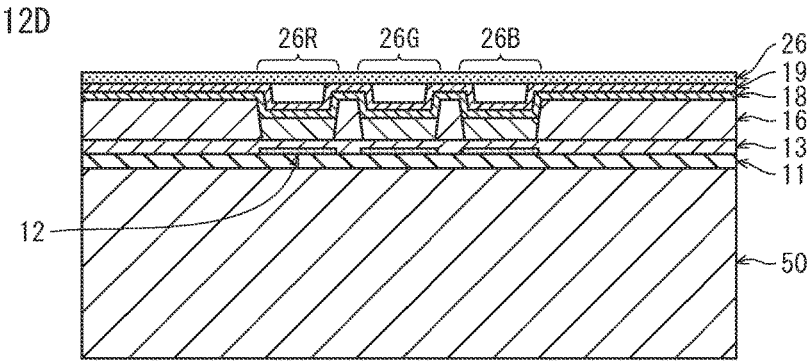

Then, the relative positional relationship of the panel made of layers up to the sealing layer 19 and the color filter substrate 26 is adjusted, and the panel made of layers up to the sealing layer 19 and the color filter substrate 26 are adhered to each other through irradiating, to ultraviolet light, the material for the adhesion layers 24 after application. Here, care must be taken so that no gas intervenes between the color filter substrate 26 and the panel made of layers up to the sealing layer 19. Then, sealing is completed by baking the color filter substrate 26 and the panel made of layers up to the sealing layer 19 (FIG. 12D).

The following describes an example of how the color filter substrate 26 is manufactured. First, a paste is prepared through dispersing a material for a color filter 26 (color filter 26G, for example) in a solvent. The material for the color filter 26G mainly contains an ultraviolet curing resin component. Then, the paste is applied on a surface of a light-transmissive substrate in which a light-shielding layer has been formed. After the solvent is removed to a predetermined extent, a predetermined pattern mask PM2 is disposed on the surface of the light-transmissive substrate on which the paste has been applied, and ultraviolet light irradiation is performed. Then, curing is performed, and development is performed after removing the pattern mask PM2 and portions of the paste which have not been cured. These processes form the color filter 26G The color filter 26R and the color filter 26B are formed through repeating similar processes by using a material for forming the color filter 26R and a material for forming the color filter 26B, respectively. Meanwhile, commercial color filter products may be used instead of using the pastes described above.

(9) Forming First layer 51 and Second Layer 52 of Substrate 50

Next, one example of how the display panel 100 is formed is described.

Figure 13A:
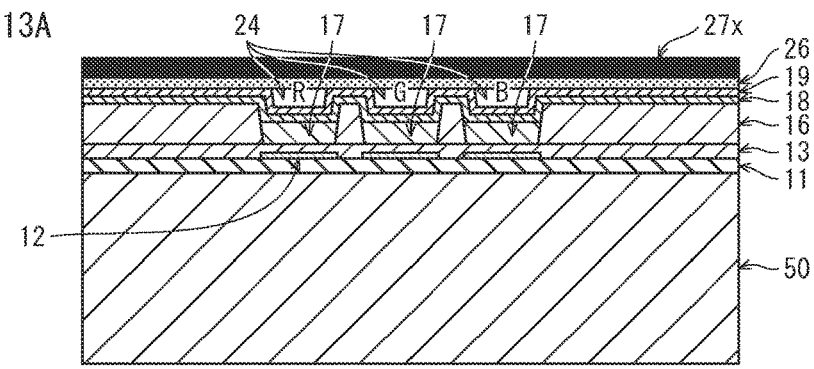
FIG. 13A through FIG. 13D are cross-sectional views illustrating processes of manufacturing the organic EL display panel 100, taken along a line corresponding to line A1-A1 in FIG. 8.

First, a photoresist layer paste 27X is prepared. The photoresist layer paste 27X mainly contains an ultraviolet curing resin (such as an ultraviolet curing acrylic resin), and is obtained by dispersing the ultraviolet curing resin and a photosensitive material in a solvent. Then, the photoresist layer paste 27X is applied on an upper surface of a panel in which layers up to the color filter substrate 26 have been formed (FIG. 13A).

Figure 13B:
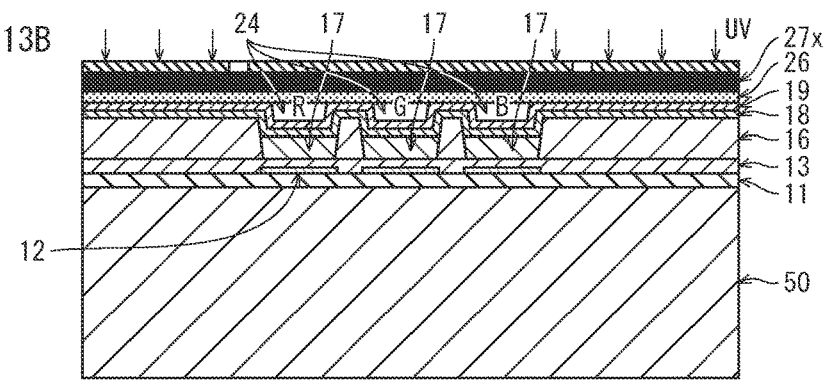
Figure 13C:
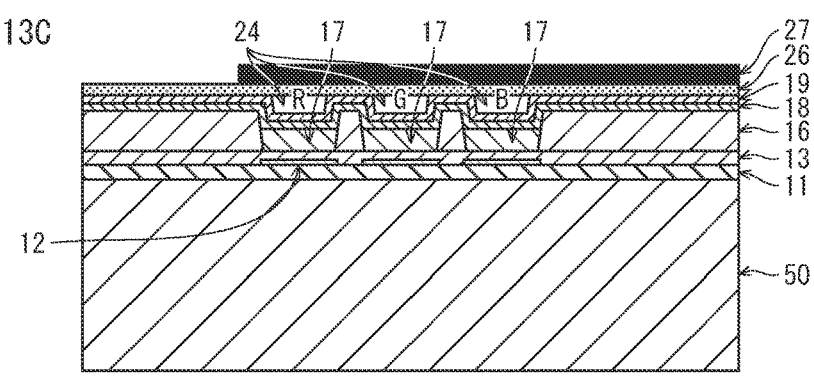
Figure 13D:
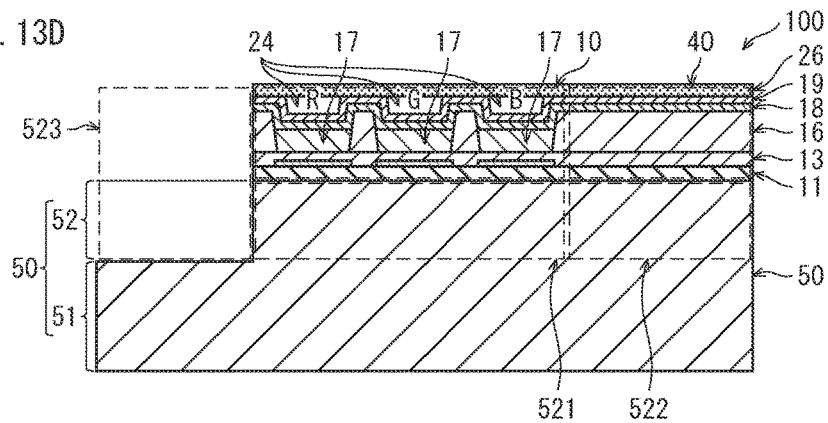

Next, the photoresist layer paste 27X after application is dried, and the solvent in the photoresist layer paste 27X is volatilized to a certain extent. Then, a pattern mask PM1 in which predetermined openings have been formed is disposed, and exposure of a pattern is performed through irradiating ultraviolet light from above the pattern mask PM1 (FIG. 13B). Then, a photoresist pattern 27 is formed through performing development by using an alkaline solution (FIG. 13C). Further, the openings 523 of the display panel 100 are formed through etching by using etching acid liquid. Then the photoresist pattern 27 is removed, and the display panel 100 is completed (FIG. 13D). Plasma etching may further be performed. The completed display panel 100 has a structure in which the substrate 50 includes the second layer 52, which includes the solid portions 521 and the fence portions 522, and the first layer 51. Further, in the completed display panel 100, the light-emitting elements 10 are on the solid portions 521, and the wire units 40 are on the fence portions 522.

4.2 Method of Manufacturing Display Device 1

A method of manufacturing the display device 1 is described, with reference to FIG. 14A through FIG. 14F. FIG. 14A through FIG. 14F are side sectional views illustrating processes of manufacturing the display device 1.

Figure 14A:
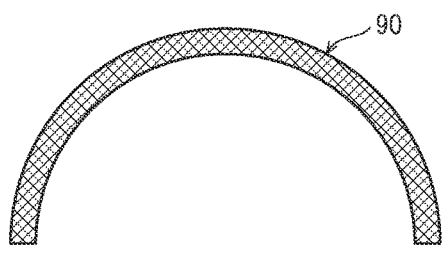
FIG. 14A through FIG. 14F are side sectional views illustrating processes of manufacturing the display device 1.
Figure 14B:
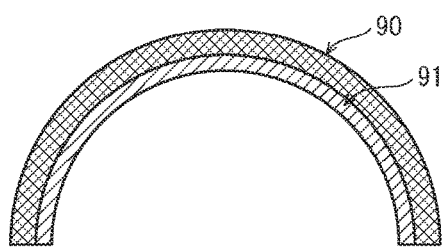

First, the receiving substrate 90, which has a curved surface shape, is prepared (FIG. 14A). Then, the sealing layer 91 is formed on the inner surface 90a of the receiving substrate 90 through vapor-depositing a light-transmissive material such as silicon nitride (SiN) or silicon oxynitride (SiON) onto the inner surface 90a (FIG. 14B). In addition to or instead of a layer of silicon nitride (SiN) or silicon oxynitride (SiON), a sealing resin layer made of a resin such as an acrylic resin or a silicone resin may be formed.

Figure 14C:
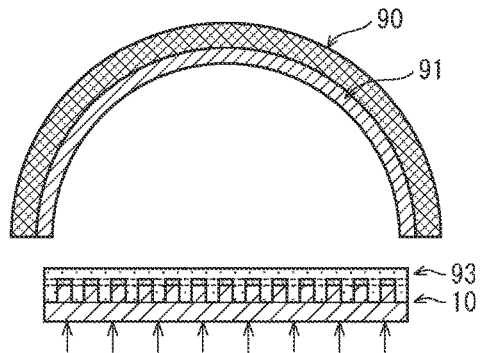
Figure 14D:
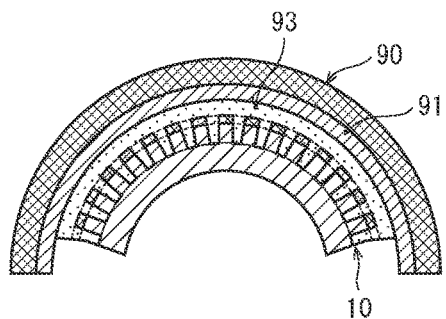

Next, the adhesion layer 93, which is made of a material such as a resin adhesive, is adhered on the display surface of the display panel 100 (FIG. 14C). Then, a process such as vacuum forming is performed in order to adhere the display panel 100 onto the inner surface 90a of the receiving substrate 90, on which the sealing layer 91 has been formed, via the adhesion layer 93. Then, the adhesion layer 93 is cured at a temperature which does not affect the organic EL light-emitting elements 10, such as 100° C. or lower (FIG. 14D).

Figure 14E:
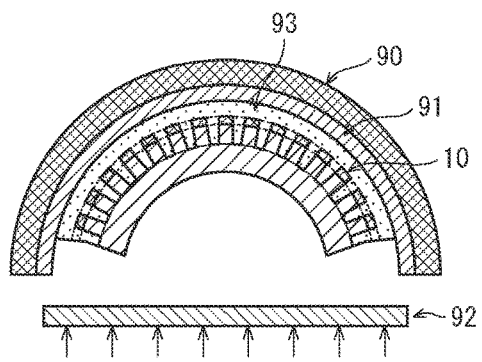

Next, the sealing layer 92 is formed through vapor-depositing a material such as silicon nitride (SiN) or silicon oxynitride (SiON) onto the rear surface of the display panel 100, so as to cover the display panel 100 (FIG. 14E). Forming of each of the sealing layers 91 and 92 may include forming of a sealing resin layer made of a resin such as an acrylic resin or a silicone resin, in addition to or instead of forming of a layer of silicon nitride (SiN) or silicon oxynitride (SiON).

Figure 14F:
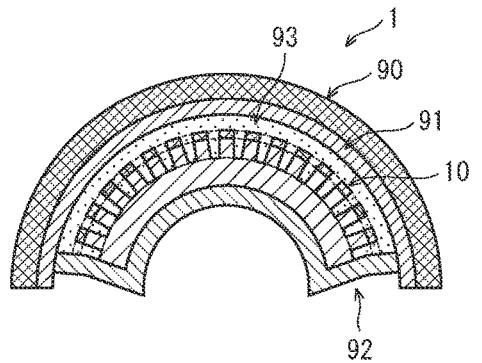

Forming of the display device 1 is completed through the above-described processes (FIG. 14F).

5. Application of Display Device 1

Figure 15A:
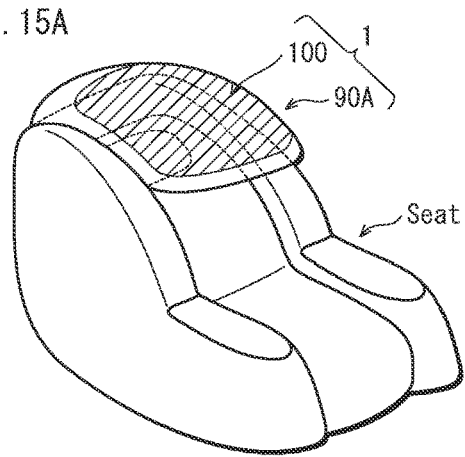
FIG. 15A through FIG. 15C are schematic views illustrating applications of the organic EL display device 1.
Figure 15B:
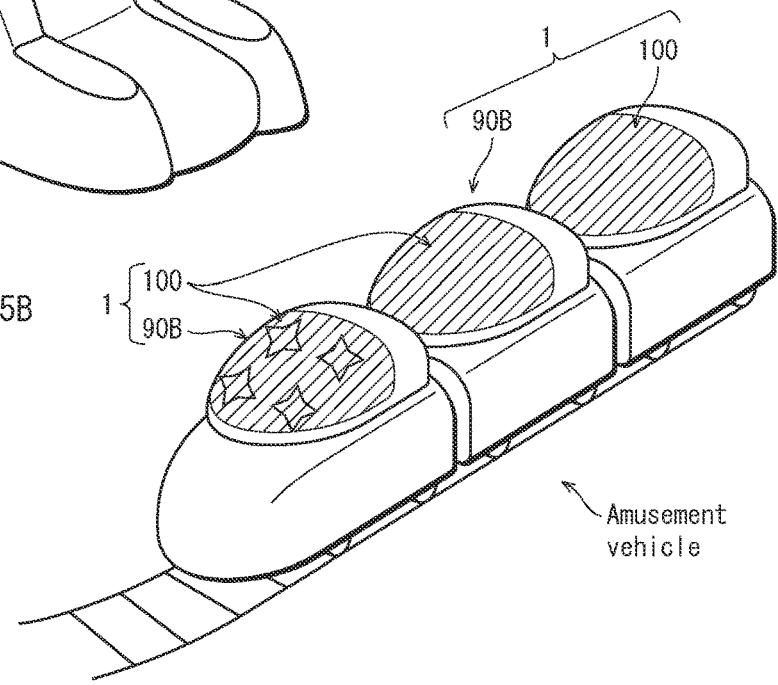
Figure 15C:
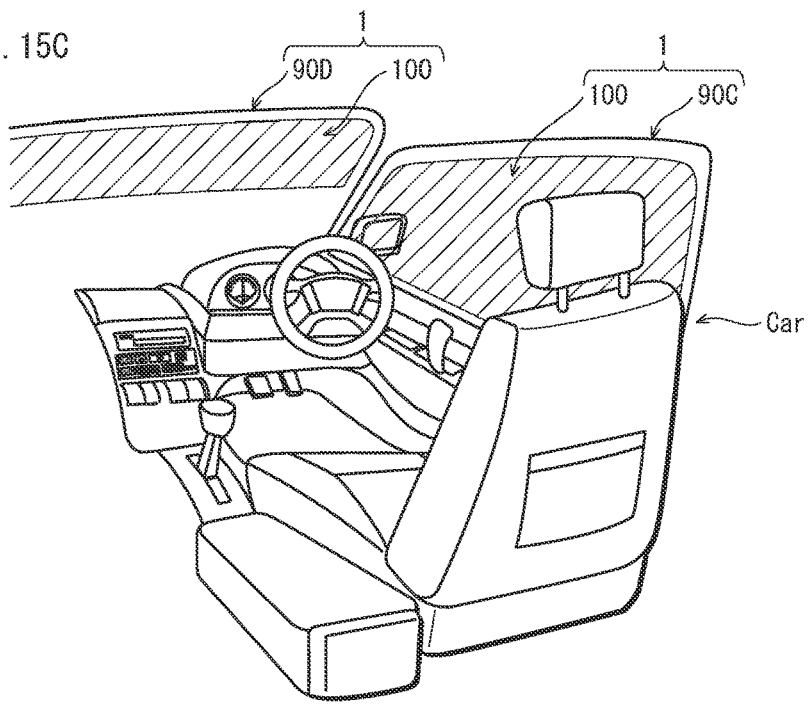

Application examples of the display device 1 are described, with reference to FIG. 15A through FIG. 15C. FIG. 15A through FIG. 15C are schematic views illustrating application examples of the organic EL display device 1.

FIG. 15A is an example in which a transparent hood 90A attached to a seat of an airplane is used as the receiving substrate 90. The display device 1 is formed by attaching the display panel 100 to an inner surface of the hood 90A. The user can visually recognize images and information displayed on the display device 1 from the inside of the hood 90A as well as visually recognizing what is happening in the airplane through the hood 90A.

FIG. 15B illustrates an example in which a transparent windshield 90B attached to an amusement vehicle used in places such as amusement facilities is used as the receiving substrate 90. The display device 1 is formed by attaching the display panel 100 to an inner surface of the windshield 90B. The user can have fun by visually recognizing images displayed on the display device 1 from inside the amusement vehicle as well as visually recognizing outside landscapes through the windshield 90B.

FIG. 15C illustrates an example in which a side window 90C and a front window 90D of a car are each used as the receiving substrates 90. The display devices 1 are formed by attaching the display panels 100 to an inner surface of the side window 90C and an inner surface of the front window 90D. The driver can drive the car while visually recognizing images and information displayed on the display devices 1 from the driver's seat as well as visually recognizing what is happening on the road through the windows 90C and 90D.

6. Effects

As described above, the organic EL display panel 100 pertaining to the embodiment includes: the substrate 50, which is flexible and is made of a resin material; the plurality of light-emitting elements 10, which are disposed on the substrate 50 and are spaced away from one another; and the plurality of wire units 40, which are disposed on the substrate 50 and establish electrical connection between the plurality of light-emitting elements 10. In the organic EL display panel 100, the first region 501 of the substrate 50, which is below the light-emitting elements 10, has greater stiffness than the second region 502 of the substrate 50, which is a remainder of the substrate 50. Further, in another aspect, the substrate 50 includes the first layer 51 and the second layer 52 in the thickness direction, the second layer 52 includes the plurality of solid portions 521, which are spaced away from each other in plan view of the substrate 50 and the plurality of fence portions 522 connecting the solid portions 521. The solid portions 521 and the fence portions 522 define the openings 523 in the second layer 52, in plan view of the substrate 50, regions in which the solid portions 521 are present correspond to the first region 51, the light-emitting elements 10 are disposed on the solid portions 521, and the wire units 40 are disposed on the fence portions.

This structure prevents the light-emitting elements 10 on upper surfaces of the solid portions 521, which form the first region 501, from deforming, because of great stiffness of the solid portions 521. Meanwhile, due to having small stiffness, the second region 502 deforms easily. This characteristic of the second region 502 contributes to great overall flexibility of the substrate 50. Further, when the second region 502 deforms, the plate-like shape or corrugated plate-like shape of the fence portions 522 enables the fence portions 522 to deform in accordance with deformation of the second region 502. That is, due to including the second layer 52, the substrate 50 has great overall flexibility. In other words, great overall flexibility of the substrate 50 can be achieved simply by forming the first layer 51 and the second layer 52 by using the same material and by providing the substrate 50 with different cross-sectional shapes in the first region 501 and the second region 502.

As a result, the organic EL display panel can be stretched along the receiving substrate 90, which has a three-dimensionally curved surface, and adhered to the receiving substrate 90 via the adhesion layer. This achieves an organic EL display panel that can be shaped so as to adapt to various three-dimensionally curved surfaces without causing wrinkling and tearing of the organic EL display panel. This also achieves an organic EL display device using such an organic EL display panel. Accordingly, curved displays with a larger variety of curved shapes than conventional curved displays are achieved.

As described above, the organic EL display panel pertaining to one aspect of the present disclosure can be shaped so as to adapt to various three-dimensionally curved surfaces without causing wrinkling and tearing of the organic EL display panel. This achieves an organic EL display device having a three-dimensionally curved display surface. Accordingly, curved displays applying to a larger variety of curved shapes than conventional curved displays are achieved.

[Modifications]

In the embodiment, the display panel 100 and the display device 1 each pertaining to one aspect of the present disclosure are described. However, the present disclosure should not be construed as being limited to the above-described embodiment, except for the essential characteristic features of the present disclosure. For example, the present disclosure includes structures which are obtained by modifying the embodiment in a manner which would be apparent to ones skilled in the art and structures which is realized by ones skilled in the art combining components and functions of the embodiment as necessary without departing from the spirit of the present disclosure. The following describes modifications of the display panel 100 as examples of such structures.

1. Structure in Which Second Layer is Made of Material with Higher Stiffness than First Layer In the display panel 100 pertaining to the embodiment, the first layer 51 and the second layer 52 are made of the same material. With this structure, great overall flexibility of the substrate 50 can be achieved by simply providing the substrate 50 with different cross-sectional shapes in the first region 501 and the second region 502.

Figure 16A:
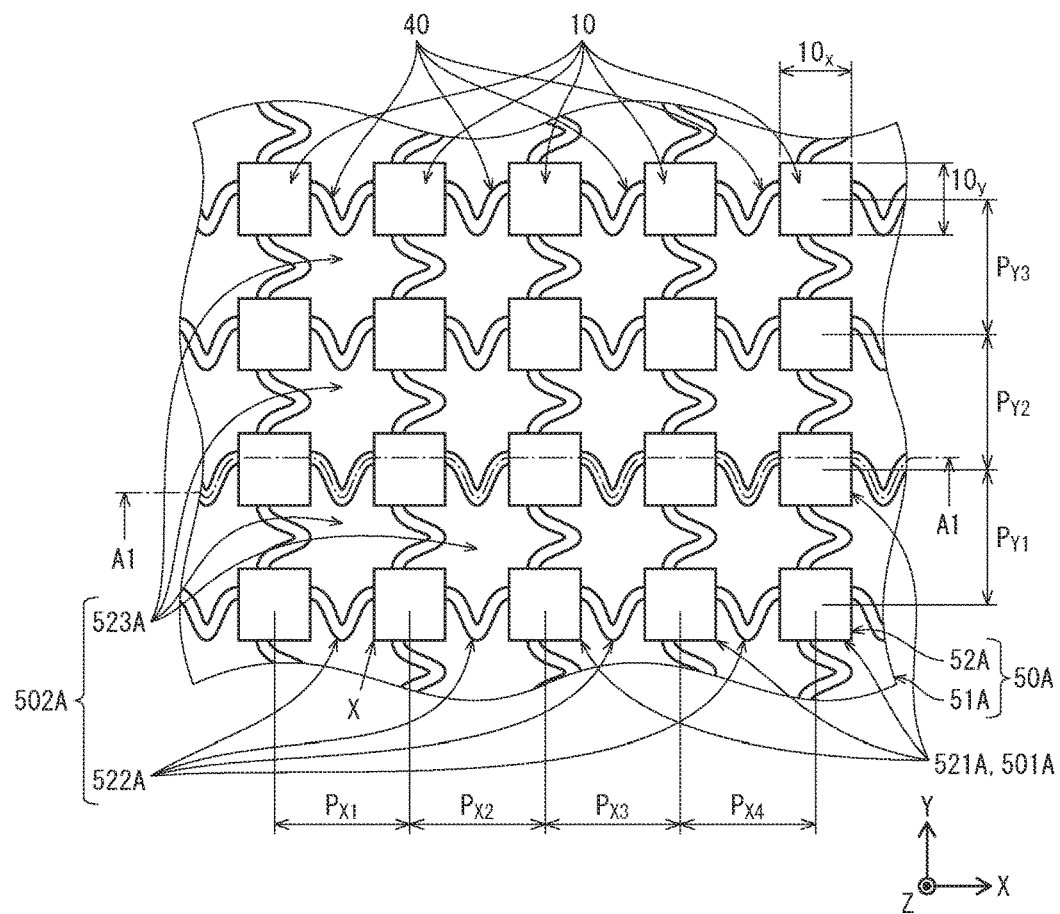
FIG. 16A is an enlarged plan view of an organic EL display panel 100A pertaining to a modification, at a portion corresponding to portion X in FIG. 5.
Figure 16B:
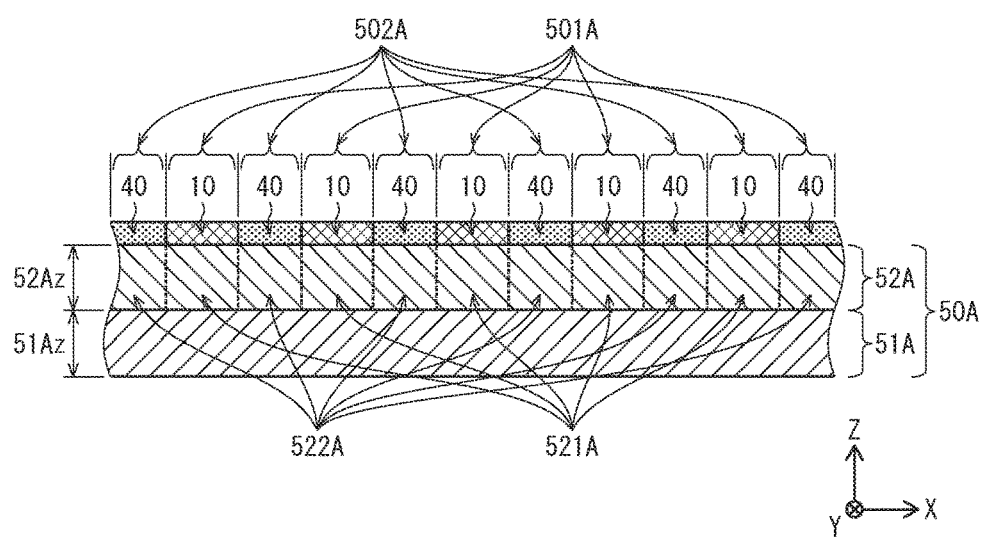
FIG. 16B is a cross-sectional view of the organic EL display panel 100A pertaining to the modification, taken along a line corresponding to line A1-A1 of FIG. 6A.

However, in the display panel 100 described as an example, a second layer 52A may be made of a material with greater stiffness than the material for a first layer 51A. FIG. 16A is an enlarged plan view of an organic EL display panel 100A pertaining to a modification, at a position corresponding to portion X in FIG. 5. FIG. 16B is a cross-sectional view of the organic EL display panel 100A pertaining to the modification, taken along a line corresponding to line A1-A1 in FIG. 6A.

As illustrated in FIG. 16A and FIG. 16B, a substrate 50A is a laminate of a first layer 51A that is located close to the rear surface of the display panel 100A and a second layer 52A that is located close to the display surface of the display panel 100A. The first layer 51A and the second layer 52A are made of different resin materials. The first layer 51A is made of a material with greater stretchability than the material for the second layer 52A. The first layer 51A is a dense layer made of the same forming material continuing in the entire substrate 50A. The second layer 52A is made of a material with greater stiffness than the material for the first layer MA. The second layer 52A includes a plurality of solid portions 521A and a plurality of fence portions 522A. The solid portions 521A have a three-dimensional shape and are spaced away from each other. The fence portions 522A have a plate-like shape or a corrugated plate-like shape and connect the solid portions 521A. Solid portions 521A and fence portions 522A connecting the solid portions 521 surround an opening 523A. Because the second layer 52A is made of a material with greater stiffness than the material for the first layer 51A, and because the second layer 52A has a plurality of openings 523A, regions of the substrate 50A where the solid portions 521A are present, which form a first region 501A, have greater stiffness than a region of the substrate 50A where the fence portions 522A and the openings 523A are present (that is, the region of the substrate 50 where the solid portions 521A do not exist), which form a second region 502A. Due to including the second layer 52, the substrate 50 has great overall flexibility.

This structure prevents the light-emitting elements 10 on upper surfaces of the solid portions 521A, which form the first region 501A, from deforming, because of great stiffness of the solid portions 521A. Meanwhile, due to having small stiffness, the second region 502A deforms easily. Accordingly, the substrate 50A has great overall flexibility.

2. Other Modifications

In the display panel 100 pertaining to the embodiment, the fence portions 522 are curved in plan view of the receiving substrate 90. However, the fence portions 522 may have various shapes in plan view of the substrate 50 that deform easily, such as a linear shape and an arc shape. This structure enables the fence portions 522 to deform in accordance with deformation of the second region 502.

Further, in the display panel 100, for any pair of a first portion and a second portion that are each a portion of the substrate 50, the first portion being closer to the periphery 50Z of the substrate 50 than the second portion, an arrangement of the light-emitting elements 10 is such that a distance between ones of the light-emitting elements 10 on the first portion is wider than a distance between ones of the light-emitting elements 10 on the second portion. However, distances between the light-emitting elements 10 on the substrate 50 may be set as necessary in accordance with the shape of the receiving substrate 90. This structure ensures substantially uniform distribution of the plurality of light-emitting elements 10 above inner surfaces 90a of receiving substrates 90 of various different shapes.

Further, in the display device 1, description is given for an example in which the receiving substrate 90 is made of a light-transmissive material such as glass or a light-transmissive resin, and the display device 1 is manufactured through: stretching the organic EL display panel 10 along a three-dimensionally curved surface of the receiving substrate 90 and adhering the display surface of the organic EL display panel 10 to the receiving substrate 90 via the adhesion layer 93; and covering the rear surface of the organic EL display panel 10 opposite the display surface with a sealing layer 92. This structure achieves visual recognition, through the receiving substrate 90, of an image displayed by the plurality of pixels 23.

However, the display device 1 may be manufactured through: stretching the organic EL display panel 10 along a three-dimensionally curved surface of the receiving substrate 90 and adhering the rear surface of the organic EL display panel 10 to the receiving substrate 90 via the adhesion layer 93; and covering the display surface of the organic EL display panel 10 with a sealing layer 92. This structure achieves visual recognition, through the sealing layer 92, of an image displayed by the plurality of pixels 23, even when the receiving substrate is made of a light-shielding material such as a metal or a non-transparent resin.

In the display panel 100 pertaining to the embodiment, the color filters 26R, 26G, and 26B are disposed above the gaps 20 in which the subpixels 21 of different colors are formed. However, in the display panel 100 described as an example, the color filters 26R, 26G, and 26B may not necessarily be disposed above the gaps 20.

Further, in the above embodiment, only the base layer 13 and the light-emitting layers 17 are interposed between the pixel electrodes 12 and the counter electrode 18. However, the present disclosure should not be construed as being limited to this. For example, the base layer 13, which is a hole injection layer, may not necessarily be provided, and only the light-emitting layers 17 may be interposed between the pixel electrodes 12 and the counter electrode 18.

Further, for example, one or more of layers such as a hole injection layer, a hole transport layer, an electron transport layer, and an electron injection layer may be included in the structure of the present disclosure. These layers may not necessarily be made of an organic compound, and may be made of, for example, an inorganic substance.

Further, in the above embodiment, the subpixels 21 include three kinds of subpixels, namely the red subpixels 21R, the green subpixels 21G, and the blue subpixels 21B, but the present disclosure should not be construed as being limited to this. For example, there may only be one kind of light-emitting layer emitting light of one color, or there may be four kinds of light-emitting layers each emitting light of a different one of the four colors red, green, blue, and yellow.

Further, in the above embodiment, the pixels 23 are arrayed linearly in the X-direction and the Y-direction, but the present disclosure should not be construed as being limited to this. For example, the present disclosure is effective in a structure in which, when assuming that each two pixel regions is spaced away from each other by one pitch, adjacent pixel regions are shifted from each other in the column direction by a half pitch.

Further, in the above embodiment, the light-emitting layers 17 are formed through a wet film-forming process such as printing, spin coating, or an ink-jet process, but the present disclosure should not be construed as being limited to this. For example, a dry film-forming process such as vacuum vapor deposition, electron beam evaporation, sputtering, reactive sputtering, ion plating, or vapor deposition may be used.

Further, in the display panel 100 pertaining to the above embodiment, the pixel electrodes 12 are disposed in all of the gaps 20. However, the present disclosure should not be construed as being limited to this. For example, the display panel 100 may include some gaps 20 in which the pixel electrodes 12 does not exist, in order to form components such as bus bars therein.

Further, in the above embodiment, the display panel 100 is a top-emission type display panel. However, the display panel 100 may be a bottom-emission type display panel. In this case, each of the components may be modified as necessary.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic EL display device comprising
an organic EL display panel comprising:
   a substrate that is flexible and is made of a resin material;
   a plurality of light-emitting elements that are disposed on the substrate and are spaced away from one another; and
   a plurality of wire units that are disposed on the substrate and establish electrical connection between the plurality of light-emitting elements, wherein
   a first region of the substrate having edges aligned with edges of the light-emitting elements, wherein the first region of the substrate has greater stiffness than a second region of the substrate that is a remainder of the substrate;
a receiving substrate having a three-dimensionally curved surface; and
a sealing layer and an adhesion layer, wherein
the sealing layer, the organic EL display panel, the adhesion layer, and the receiving substrate are laminated in this order.

2. The organic EL display device of claim 1, wherein the wire units are disposed above the second region.

3. The organic EL display device of claim 1, wherein the substrate has a greater mean thickness at the first region than at the second region.

4. The organic EL display device of claim 1, wherein
the first layer and the second layer are made of a same material, and
in a thickness direction of the substrate, the first layer and the second layer are continuous with each other in the first region.

5. The organic EL display device of claim 1, wherein
the first layer is made of a first material,
the second layer is made of a second material, and
the first material has greater stiffness than the second material.

6. The organic EL display device of claim 1, wherein the fence portions are curved in plan view of the substrate.

7. The organic EL display device of claim 1, wherein the substrate is light-transmissive.

8. The organic EL display device of claim 1, wherein
for any pair of a first portion and a second portion that are each a portion of the substrate, the first portion being closer to a periphery of the substrate than the second portion,
an arrangement of the light-emitting elements is such that a distance between ones of the light-emitting elements on the first portion is wider than a distance between ones of the light-emitting elements on the second portion.

9. The organic EL display device of claim 1, wherein
the receiving substrate is light-transmissive, and
a display surface of the organic EL display panel faces the receiving substrate.

10. The organic EL display device of claim 1, wherein
a display surface of the organic EL display panel faces away from the receiving substrate.

11. The organic EL display device of claim 1, wherein
an arrangement of the light-emitting elements is such that distance distribution between the light-emitting elements on the substrate is set in accordance with a shape of the receiving substrate.

12. A method of manufacturing an organic EL display device, comprising:
preparing the organic EL display device of claim 1;
stretching the organic EL display panel along a three-dimensionally curved surface of a receiving substrate and adhering a first surface of the organic EL display panel to the receiving substrate via an adhesion layer; and
covering a second surface of the organic EL display panel opposite the first surface with a sealing layer.

13. The method of claim 12, wherein
the organic EL display panel is stretched so that a stretch ratio of the organic EL display panel differs depending on directions along a surface of the organic EL display panel.

14. The method of claim 12, wherein
the organic EL display panel is stretched so that different portions of the organic EL display panel have different stretch ratios.

* * * * *